United States Patent
Lee

(10) Patent No.: US 11,017,865 B2
(45) Date of Patent: May 25, 2021

(54) MEMORY CONTROLLER DETERMINING OPTIMAL READ VOLTAGE AND OPERATING METHOD THEREOF

(71) Applicant: SK hynix Inc., Gyeonggi-do (KR)

(72) Inventor: Jae Yoon Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/728,197

(22) Filed: Dec. 27, 2019

(65) Prior Publication Data
US 2021/0065816 A1 Mar. 4, 2021

(30) Foreign Application Priority Data
Sep. 3, 2019 (KR) .................. 10-2019-0109123

(51) Int. Cl.
| | | |
|---|---|---|
| *G11C 16/26* | (2006.01) | |
| *G11C 16/12* | (2006.01) | |
| *G11C 29/44* | (2006.01) | |
| *G11C 29/42* | (2006.01) | |
| *G11C 16/34* | (2006.01) | |

(52) U.S. Cl.
CPC .............. *G11C 16/26* (2013.01); *G11C 16/12* (2013.01); *G11C 16/34* (2013.01); *G11C 29/42* (2013.01); *G11C 29/44* (2013.01)

(58) Field of Classification Search
CPC ......... G11C 16/26; G11C 16/12; G11C 16/34; G11C 29/42; G11C 29/44
See application file for complete search history.

(56) References Cited

U.S. PATENT DOCUMENTS

| | | | | |
|---|---|---|---|---|
| 7,941,590 | B2 * | 5/2011 | Yang ................... | G11C 16/28 711/103 |
| 8,072,805 | B2 * | 12/2011 | Chou ................... | G11C 16/34 365/185.03 |
| 8,576,625 | B1 * | 11/2013 | Yang .................. | G11C 16/3422 365/185.09 |
| 8,665,650 | B2 * | 3/2014 | Yang ................... | G06F 11/1048 365/185.2 |
| 9,330,775 | B2 * | 5/2016 | Kim ..................... | G11C 16/28 |

(Continued)

FOREIGN PATENT DOCUMENTS

| | | |
|---|---|---|
| KR | 10-2018-0027660 | 3/2018 |
| KR | 10-2018-0042974 | 4/2018 |

*Primary Examiner* — Vanthu T Nguyen
(74) *Attorney, Agent, or Firm* — IP & T Group LLP

(57) ABSTRACT

A memory controller for performing soft decoding according to a Cell Difference Probability (CDP) calculated based on a cell distribution controls a memory device. The memory controller for controlling the memory device, the memory controller comprising: an error corrector configured to correct an error in read data received from the memory device; a command generator configured to output, in response to failing an error correction operation of the error corrector, a cell distribution detection command for detecting threshold voltage distributions of memory cells included in the memory device; and a read voltage controller configured to determine, based on cell distribution detection data that the memory device provides in response to the cell distribution detection command, a number of read voltages for a read operation to be performed in the memory device and an interval between neighboring ones among the read voltages.

20 Claims, 18 Drawing Sheets

(56) References Cited

U.S. PATENT DOCUMENTS

| | | | |
|---|---|---|---|
| 9,412,471 B2* | 8/2016 | Kim | G06F 11/1068 |
| 9,582,362 B2* | 2/2017 | Ratnam | G06F 3/064 |
| 10,475,523 B2* | 11/2019 | Sharon | G06F 11/1012 |
| 2009/0300465 A1* | 12/2009 | Wu | G11C 11/5642 |
| | | | 714/763 |

* cited by examiner

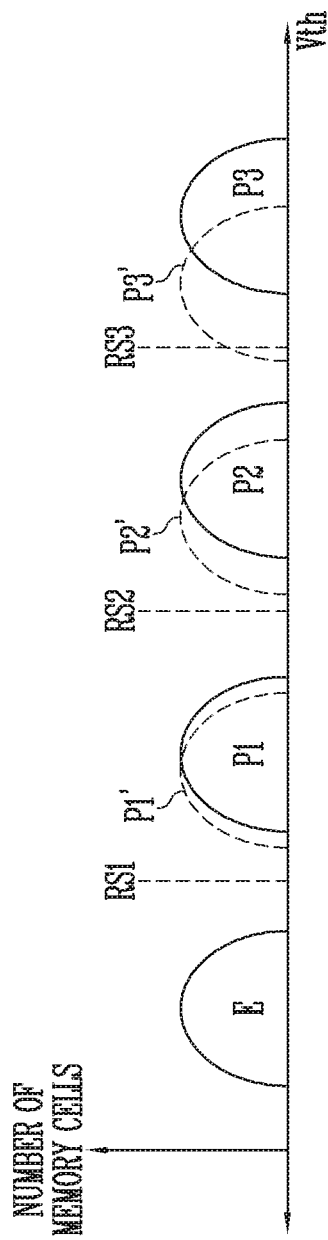

|  | RS31 | RS32 | RS33 | RS34 | RS35 |
|---|---|---|---|---|---|
| ONES | 2600 | 2800 | 2900 | 3100 | 3500 |

FIG. 7A $$\text{CDP (Cell Difference Probability)} = \frac{\text{ONES} - (\text{NOC} * \text{Pi})}{\text{NOC}}$$

FIG. 7B

|      | RS31 | RS32 | RS33 | RS34 | RS35 |
|------|------|------|------|------|------|
| ONES | 2600 | 2800 | 2900 | 3100 | 3500 |
| CDP  | -0.4 | -0.2 | -0.1 | 0.1  | 0.5  |

0.2   0.1   0.2   0.4

MEMORY CONTROLLER DETERMINING OPTIMAL READ VOLTAGE AND OPERATING METHOD THEREOF

CROSS-REFERENCE TO RELATED APPLICATION

The present application claims priority under 35 U.S.C. § 119(a) to Korean patent application number 10-2019-0109123 filed on Sep. 3, 2019, which is incorporated herein by reference in its entirety.

BACKGROUND

1. Field of Invention

The present disclosure generally relates to an electronic device, and more particularly, to a memory controller for a memory device and an operating method thereof.

2. Description of Related Art

A storage device is a device configured to store data under the control of a host device such as a computer, a smart phone or a smart pad. The storage device may include a device configured to store data on a magnetic disk, such as a Hard Disk Drive (HDD), and a device configured to store data on a semiconductor memory, i.e., a nonvolatile memory, such as a Solid State Drive (SSD) or a memory card.

The storage device may include a semiconductor-based memory device (hereinafter simply referred to as a memory device) configured to store data and a memory controller configured to control the memory device. A memory device may be classified into a volatile memory device and a nonvolatile memory device. A nonvolatile memory device includes a Read Only Memory (ROM), a Programmable ROM (PROM), an Electrically Programmable ROM (EPROM), an Electrically Erasable and Programmable ROM (EEPROM), a flash memory, a Phase-change RAM (PRAM), a Magnetic RAM (MRAM), a Resistive RAM (RRAM), a Ferroelectric RAM (FRAM), and the like.

SUMMARY

Various embodiments of the present invention provide a memory controller for performing a soft decoding operation. The soft decoding operation may include calculating a cell difference probability based on a cell distribution. Various embodiments of the present invention also provide an operating method of a storage device including the memory controller.

In accordance with an aspect of the present disclosure, there is provided a memory controller for controlling a memory device, the memory controller comprising: an error corrector configured to correct an error in read data received from the memory device; a command generator configured to output, in response to failing an error correction operation of the error corrector, a cell distribution detection command for detecting threshold voltage distributions of memory cells included in the memory device; and a read voltage controller configured to determine, based on cell distribution detection data that the memory device provides in response to the cell distribution detection command, a number of read voltages for a read operation to be performed in the memory device and an interval between neighboring ones among the read voltages.

In accordance with another aspect of the present disclosure, there is provided a method for operating a memory controller for controlling a memory device, the method comprising: correcting an error of read data received from the memory device; outputting, in response to failing an error correction operation of the error corrector, a cell distribution detection command for detecting threshold voltage distributions of memory cells included in the memory device; and determining, based on cell distribution detection data that the memory device provides in response to the cell distribution detection command, a number of read voltages for a read operation to be performed in the memory device and an interval between neighboring ones among the read voltages.

In accordance with another aspect of the present disclosure, there is provided an operating method of a controller for controlling a memory device, the operating method comprising: controlling the memory device to read data therefrom by using reference read voltages; and controlling the memory device to read data therefrom by using actual read voltages determined on a basis of a cell difference probabilities (CDPs) and a variation between neighboring ones among the CDPs, wherein the CDP corresponding to a selected one among the reference read voltages is provided by the following equation: $CDP=\{A-(B*C)\}/B$, wherein A represents an actual number of memory cells turned on due to the selected reference read voltage, wherein B represents a reference number of memory cells belonging to each of ideal threshold voltage distributions; and wherein C represents a predicted number of threshold voltage distributions, to which one or more memory cells belonging would be turned on due to the selected reference read voltage.

BRIEF DESCRIPTION OF THE DRAWINGS

Example embodiments of the present invention will now be described more fully hereinafter with reference to the accompanying drawings; however, we note that the present invention may be embodied in different other embodiments and variations thereof and should not be construed as limited only to the embodiments set forth herein. Rather, these embodiments are provided so that this disclosure will be thorough and complete, and will fully convey the scope of the example embodiments to those skilled in the art.

It should be understood that the drawings are simplified schematic illustrations of the described devices and may not include well known details for avoiding obscuring the features of the invention, and that dimensions may be exaggerated for clarity of illustration.

Figure 1:
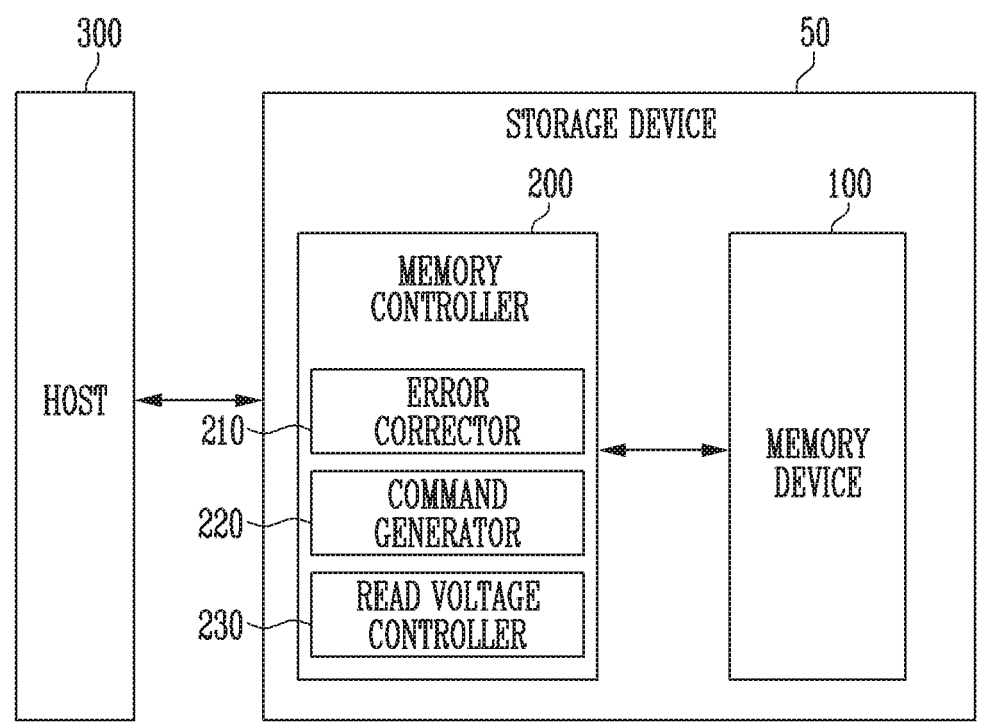

It should also be noted that features present in one embodiment may be used with one or more features of another embodiment without departing from the scope of the invention.

It will be understood that when an element is referred to as being "between" two elements, it can be the only element between the two elements, or one or more intervening elements may also be present. Like reference numerals refer to like elements throughout.

FIG. 1 is a block diagram illustrating a storage device including a memory controller and a memory device according to an embodiment of the present invention.

Figure 2:
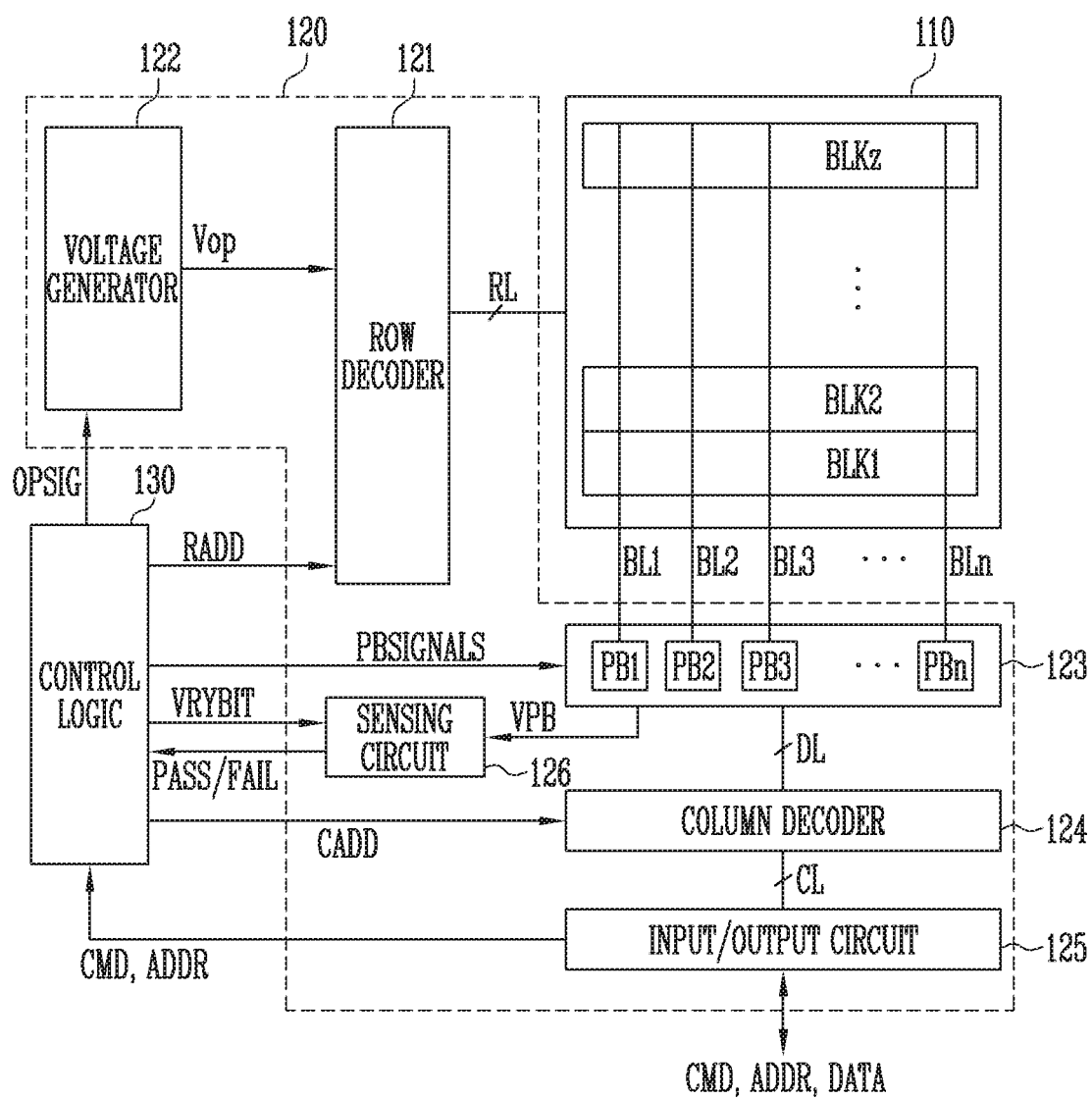

FIG. 2 is a diagram illustrating a structure of the memory device shown in FIG. 1 according to an embodiment of the present invention.

Figure 3:
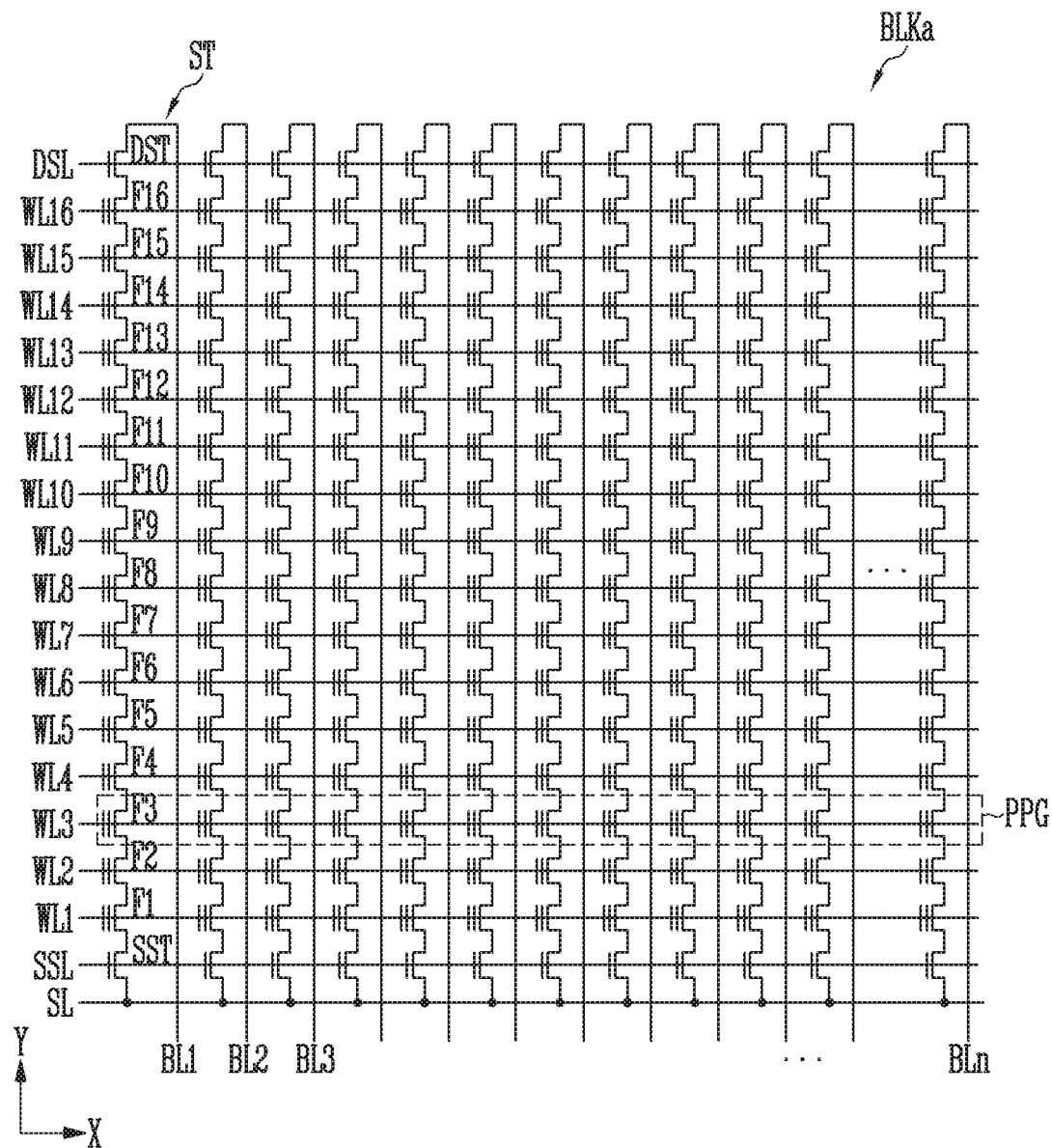

FIG. 3 is a diagram illustrating a memory block according to an embodiment of the present invention.

Figure 4:
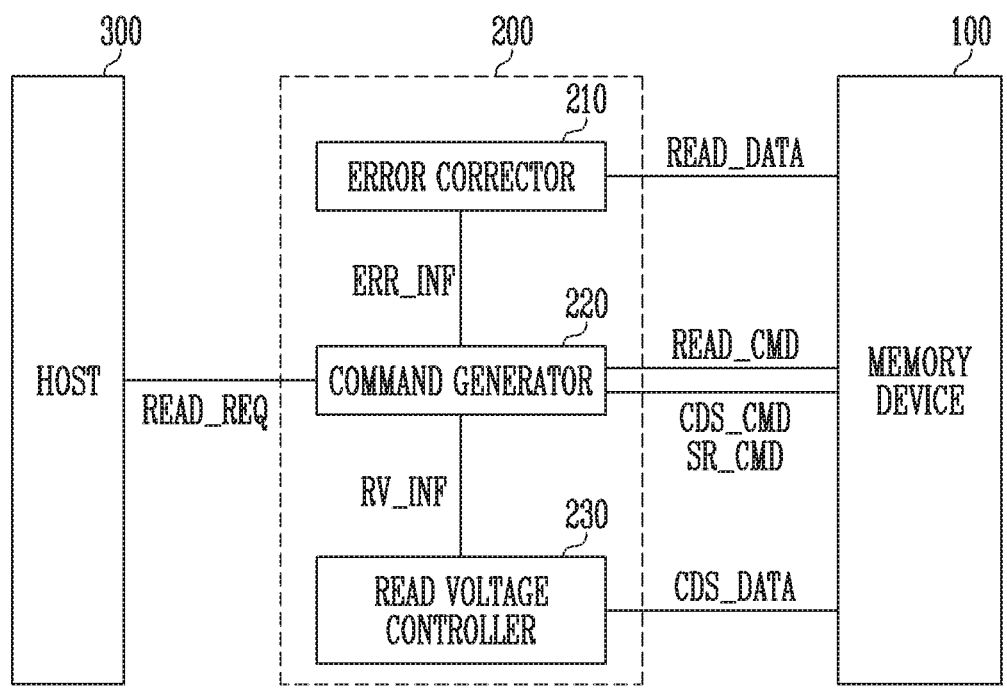

FIG. 4 is a diagram illustrating a process of outputting a soft read command according to an embodiment of the present invention.

FIGS. 5A and 5B illustrate an operation corresponding to a cell distribution detection command according to an embodiment of the present invention.

Figures 6A, 6B:
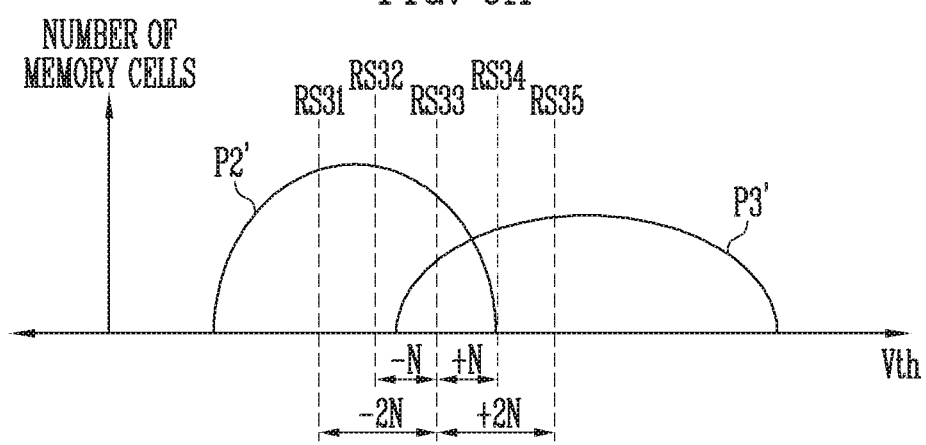

FIGS. 6A and 6B illustrate read voltages corresponding to a cell distribution detection command and cell distribution detection data according to an embodiment of the present invention.

FIGS. 7A and 7B illustrate a Cell Difference Probability (CDP) according to an embodiment of the present invention.

Figure 8:
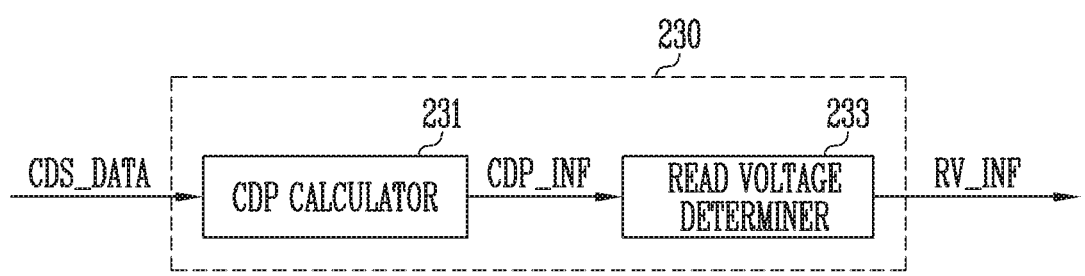

FIG. 8 is a diagram illustrating an operation of a read voltage controller that generates read voltage information, based on cell distribution data according to an embodiment of the present invention.

Figure 9:
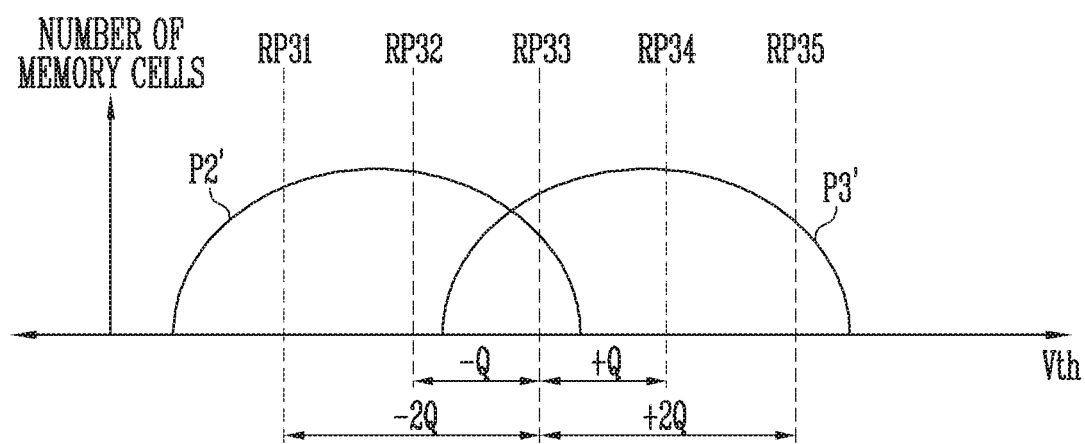

FIG. 9 is a diagram illustrating an embodiment of read voltages determined when a variation in CDP is substantially constant.

Figure 10:
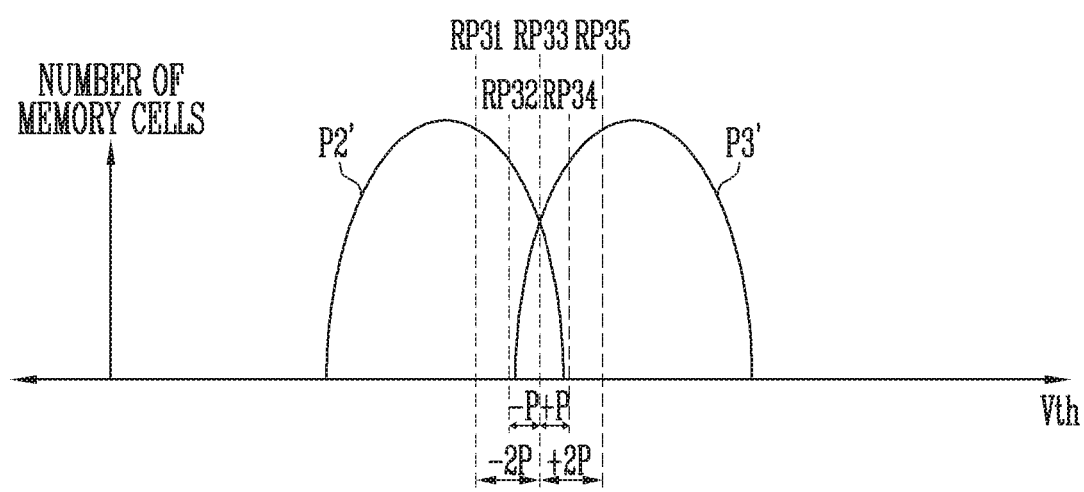

FIG. 10 is a diagram illustrating another embodiment of the read voltages determined when the variation in CDP is substantially constant according to an embodiment of the present invention.

Figure 11:
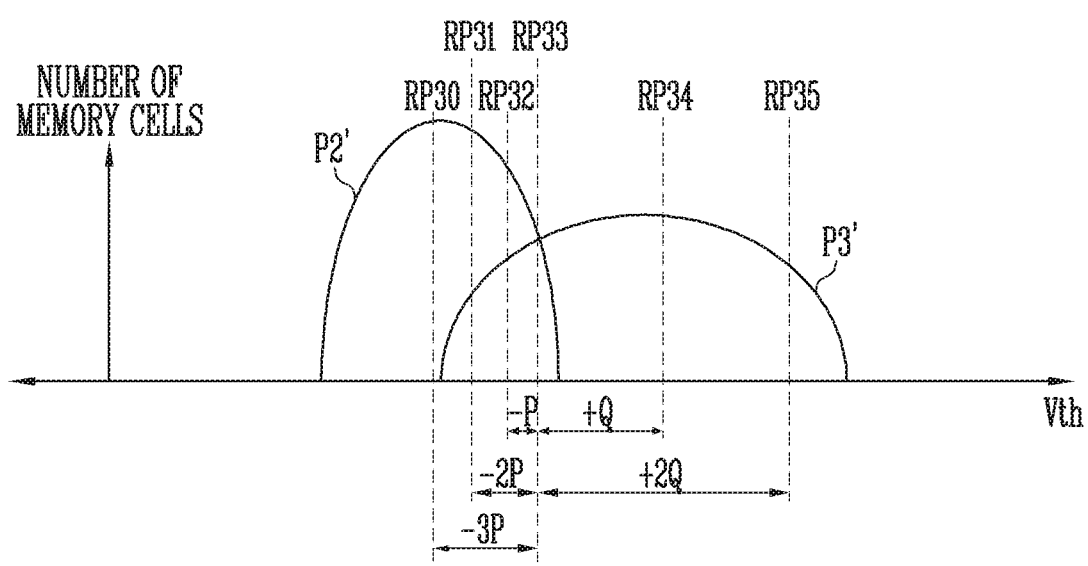

FIG. 11 is a diagram illustrating an embodiment of read voltages determined when the variation in CDP is not substantially constant according to an embodiment of the present invention.

Figure 12:
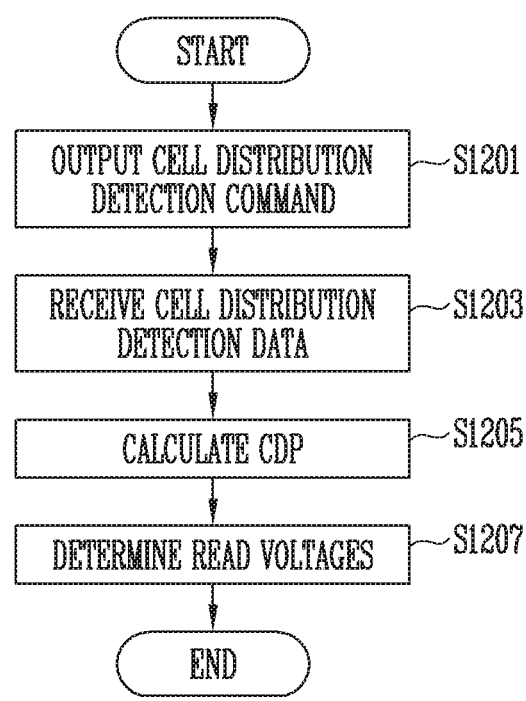

FIG. 12 is a diagram illustrating an operation of a memory controller according to an embodiment of the present invention.

Figure 13:
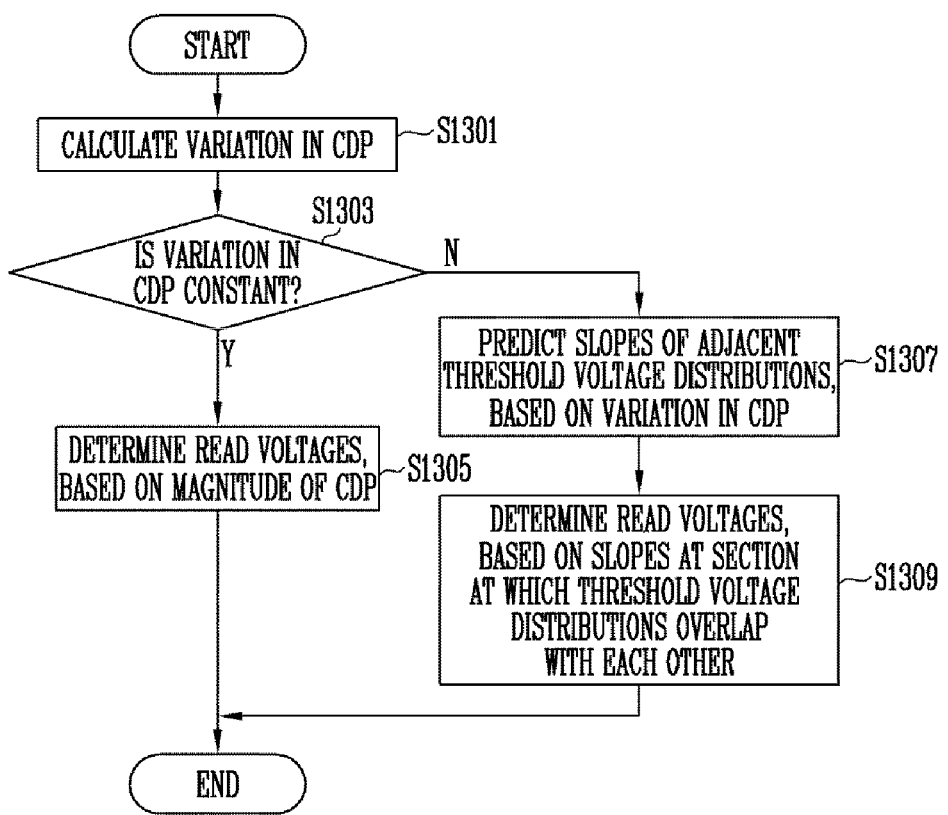

FIG. 13 is a diagram illustrating an operation of the memory controller according to an embodiment of the present invention.

Figure 14:
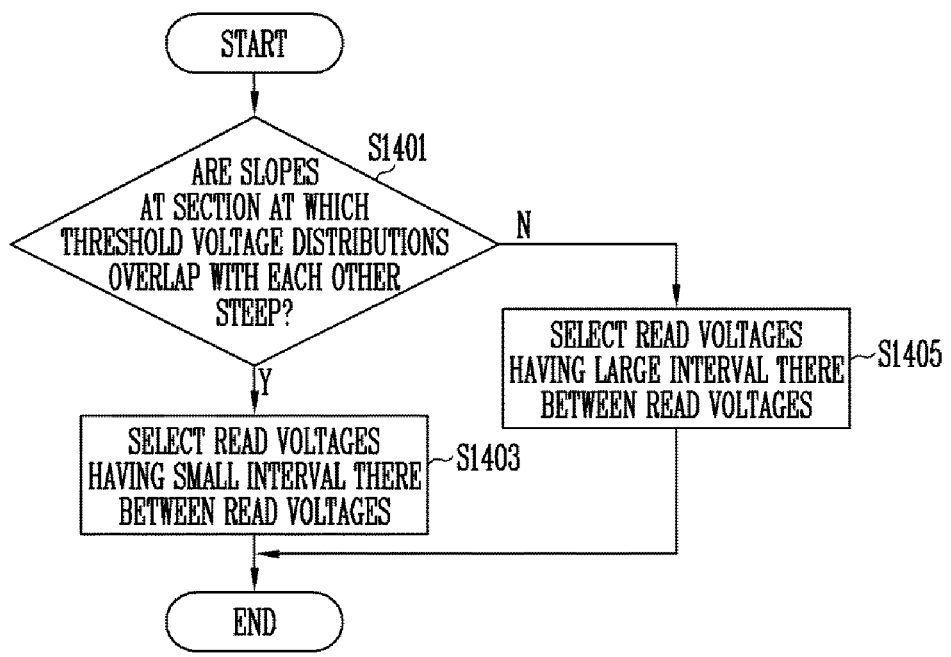

FIG. 14 is a diagram illustrating an operation of the memory controller according to an embodiment of the present invention.

Figure 15:
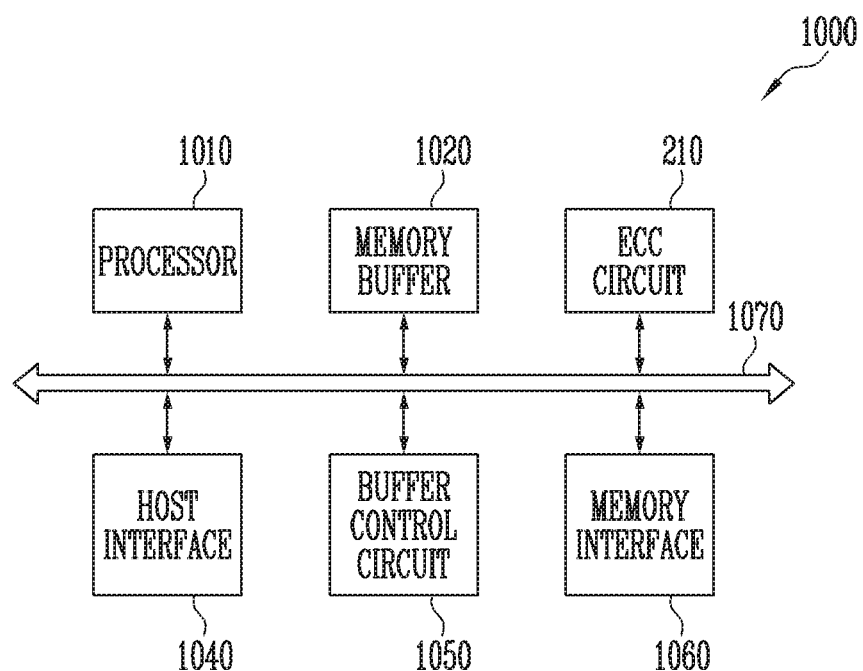

FIG. 15 is a diagram illustrating another embodiment of the memory controller shown in FIG. 1.

Figure 16:
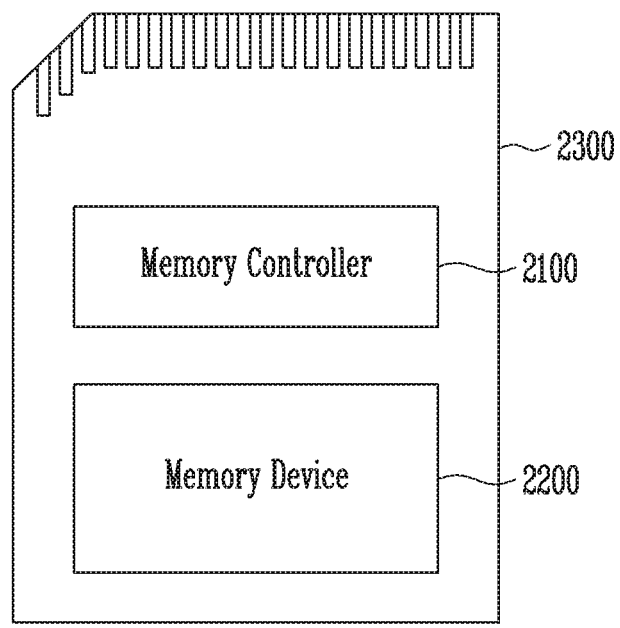

FIG. 16 is a block diagram illustrating a memory card system to which the storage device is applied according to an embodiment of the present invention.

Figure 17:
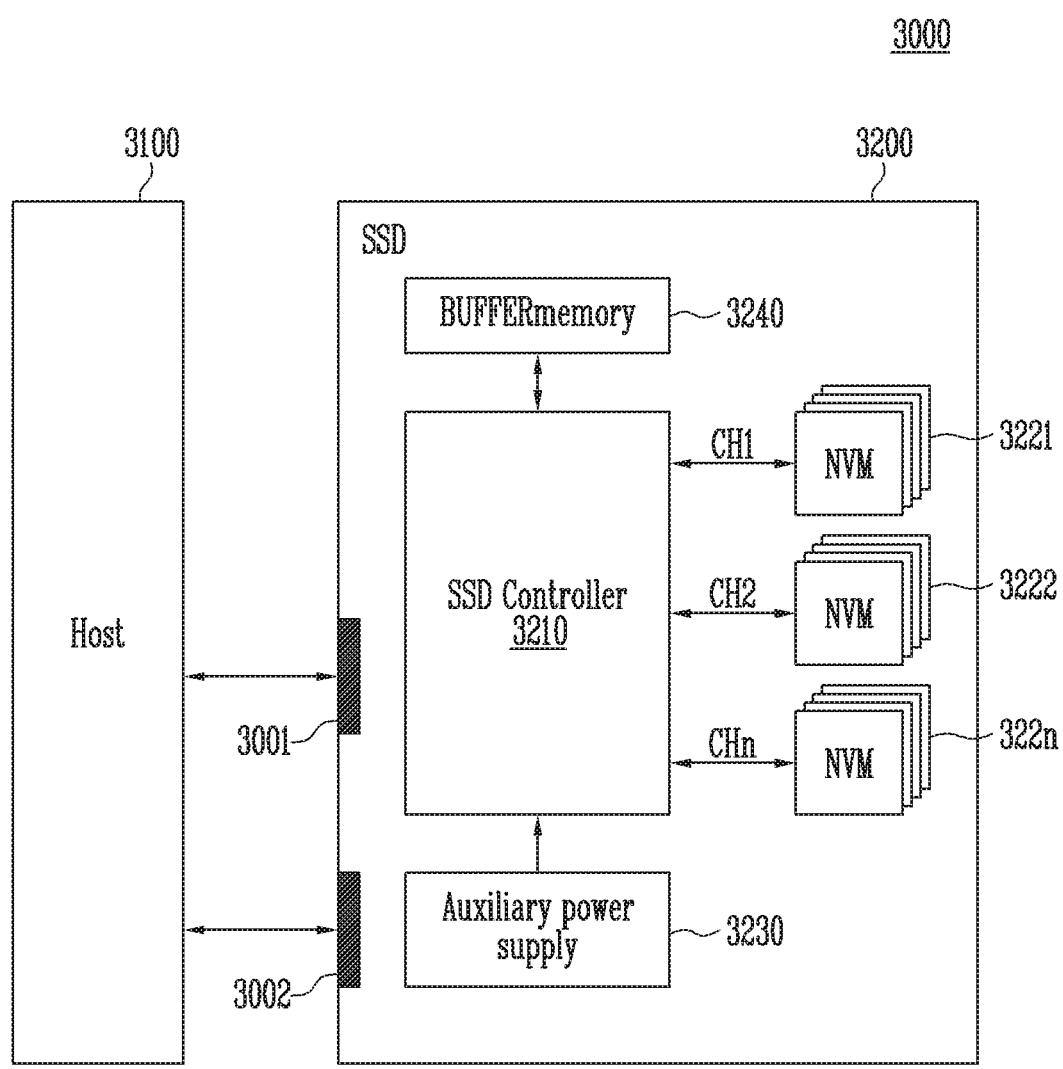

FIG. 17 is a block diagram illustrating a Solid State Drive (SSD) system to which the storage device is applied according to an embodiment of the present invention.

Figure 18:
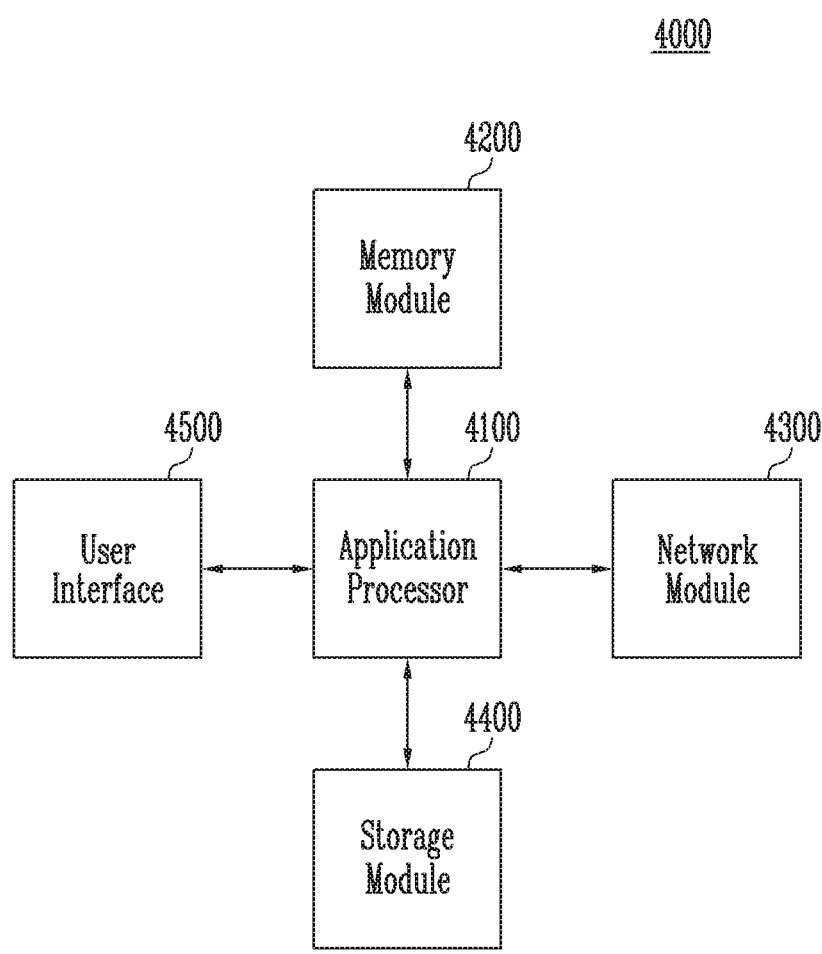

FIG. 18 is a block diagram illustrating a user system to which the storage device is applied according to an embodiment of the present invention.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Hereinafter, embodiments of the present disclosure will be described in detail with reference to the accompanying drawings in order for those skilled in the art to be able to readily implement the technical spirit of the present disclosure.

FIG. 1 is a block diagram illustrating a storage device 50.

Referring to FIG. 1, the storage device 50 may be coupled to a host 300 and may include a memory device 100 and a memory controller 200.

The storage device 50 may store data under the control of the host 300. The host 300 may be any suitable electronic device including, for example, a mobile phone, a smart phone, an MP3 player, a laptop computer, a desktop computer, a game console, a TV, a tablet PC or an in-vehicle infotainment.

The storage device 50 may be manufactured as any one of various types of storage devices according to a host interface that is a communication scheme with the host 300. For example, the storage device 50 may be implemented with any one of a variety of types of storage devices, such as a Solid State Drive (SSD), a Multi-Media Card (MMC), an Embedded MMC (eMMC), a Reduced Size MMC (RS-MMC), a micro-MMC (micro-MMC), a Secure Digital (SD) card, a mini-SD card, a micro-SD card, a Universal Serial Bus (USB) storage device, a Universal Flash Storage (UFS) device, a Compact Flash (CF) card, a Smart Media Card (SMC), a memory stick, and the like.

The storage device 50 may be manufactured as any one of various kinds of package types. For example, the storage device 50 may be manufactured as any one of various kinds of package types such as a Package-On-Package (POP), a System-In-Package (SIP), a System-On-Chip (SOC), a Multi-Chip Package (MCP), a Chip-On-Board (COB), a Wafer-level Fabricated Package (WFP), and a Wafer-level Stack Package (WSP).

The memory device 100 may store data. The memory device 100 may operate under the control of the memory controller 200. The memory device 100 may include a memory cell array including a plurality of memory cells for storing data. The memory cell array may include a plurality of memory blocks. Each memory block may include a plurality of memory cells, and the plurality of memory cells may constitute a plurality of pages. In an embodiment, the page may be a unit for storing data in the memory device 100 or reading data stored in the memory device 100. The memory block may be a unit for erasing data.

In an embodiment, the memory device 100 may be a Double Data Rate Synchronous Dynamic Random Access Memory (DDR SDRAM), a Low Power Double Data Rate 4 (LPDDR4) SDRAM, a Graphics Double Data Rate (GDDR) SRAM, a Low Power DDR (LPDDR), a Rambus Dynamic Random Access Memory (RDRAM), a NAND flash memory, a vertical NAND flash memory, a NOR flash memory, a Resistive Random Access Memory (RRAM), a Phase-Change Random Access Memory (PRAM), a Magnetoresistive Random Access Memory (MRAM), a Ferroelectric Random Access Memory (FRAM), a Spin Transfer Torque Random Access Memory (STT-RAM), or the like. In the following description, an example where the memory device 100 is a NAND flash memory is described in more detail.

In an embodiment, the memory device 100 may be implemented in a two-dimensional array structure or a three-dimensional array structure. Hereinafter, a case where the memory device 100 is implemented in a three-dimensional array structure is described as an embodiment, however, the present invention is not limited to the three-dimensional array structure. Moreover, we note that the present invention may be applied to not only a flash memory device in which a charge storage layer is configured with a Floating Gate (FG) but also a Charge Trap Flash (CTF) in which a charge storage layer is configured with an insulating layer.

In an embodiment, the memory device 100 may be operated using a Single Level Cell (SLC) scheme in which one data bit is stored in one memory cell. Alternatively, the memory device 100 may be operated using a scheme in which at least two data bits are stored in one memory cell. For example, the memory device 100 may be operated using a Multi-Level Cell (MLC) scheme in which two or more data bits are stored in one memory cell. A scheme in which three data bits are stored in one memory cell may be referred to as a Triple Level Cell (TLC) scheme. A scheme in which four data bits are stored in one memory cell may be referred to as a Quadruple Level Cell (QLC) scheme.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write (program) operation, a read operation, or an erase operation according to a received command. For example, when a program command is received, the memory device 100 may program data in the area selected by the address. When a read command is received, the memory device 100 may read data from the area selected by the address. When an erase command is received, the memory device 100 may erase data stored in the area selected by the address.

The memory controller 200 may transmit randomized data to the memory device 100. The randomized data may be formed by encoding data received from the host 300. The memory controller 200 may output to the host 300, data derandomized by decoding data read from the memory device 100. Also, the memory controller 200 may include an error corrector 210. The error corrector may correct a data error in the data received from the memory device 100.

For example, when the memory controller 200 receives a read request from the host 300, the memory controller 200 may output a read command generated based on the read request to the memory device 100, and receive read data corresponding to the read command from the memory device 100. However, an error may be included in the read data either created during the read process or due to a degradation of the corresponding memory cells caused by some reason such as, for example a data retention issue.

The error corrector 210 may perform an error correction operation so as to correct the error included in the read data. For example, the error corrector 210 may correct a data error by using an error correction code such as a Bose-Chaudhuri-Hocquenghem (BCH) code or a Low-Density Parity Check (LDPC) code.

However, in some instances, although the error corrector 210 has performed the error correction operation, the error may not be corrected. Therefore, in such instances, the error corrector 210 may generate error information representing that the error has not been corrected. As a result, the memory controller 200 may perform an additional operation for correcting the error, based on the error information. For example, the memory controller 200 may output, to the memory device 100, a read retry command instructing the memory device 100 to read data by using a modified read voltage, and the memory device 100 may perform a read operation by using the modified read voltage.

The memory controller 200 may include a command generator 220. The command generator 220 may generate a command corresponding to a request received from the host 300 or a command corresponding to an internal operation of the memory controller 200. When the memory device 100 receives a command from the command generator 200, the memory device 100 may perform an operation corresponding to the command.

For example, when the command generator 220 receives a read request from the host 300, the command generator 220 may generate a read command and output the generated read command to the memory device 100 so as to perform a read operation corresponding to the read request. Also, the command generator 220 may output a soft read command, based on read voltage information received from a read voltage controller 230 after a read operation fails. The soft read command may be a command instructing the memory device 100 to perform a read operation, based on a read voltage determined by the read voltage controller 230.

In an embodiment, the command generator 220 may output a cell distribution detection command, based on the error information received from the error corrector 210. The cell distribution detection command may be a command for detecting a threshold voltage distribution of memory cells included in the memory device 100. For example, after the memory device 100 performs a read operation corresponding to the cell distribution detection command, the memory device 100 may output information corresponding to the number of memory cells turned on to the memory controller 200.

The memory controller 200 may include the read voltage controller 230. The read voltage controller 230 may receive the cell distribution detection data corresponding to the cell distribution detection command, and determine a read voltage based on the cell distribution detection data.

Specifically, the read voltage controller 230 may calculate a cell difference probability (CDP) of read data based on the cell distribution detection data. The CDP represents a reliability of read data obtained by performing a read operation. The reliability of read data may become greater as the CDP becomes smaller. The read voltage controller 230 may calculate a variation of the calculated CDP, based on the CDP. The read voltage controller 230 may determine a read voltage by predicting slopes of adjacent threshold voltage distributions, based on the variation of the CDP. That is, slopes at a section at which adjacent threshold voltages overlap with each other may be predicted, and a read voltage may be determined based on the predicted slopes.

For example, when the variation of the CDP is substantially constant, the read voltage controller 230 may determine an interval between neighboring ones among the actual read voltages and a number of the actual read voltages according to the magnitude of the CDP. On the contrary, when the variation of the CDP is not substantially constant, the read voltage controller 230 may determine an interval between neighboring ones among the actual read voltages and a number of the actual read voltages according to the predicted slopes.

The memory controller 200 may control the overall operations of the storage device 50.

When a power voltage is applied to the storage device 50, the memory controller 200 may execute a firmware (FW). When the memory device 100 is a flash memory device, the memory controller 200 may execute a FW such as an FTL (Flash translation layer) for controlling communication between the host 300 and the memory device 100.

In an embodiment, the memory controller 200 may receive data and a Logical Block Address (LBA) from the host 300, and translate the LBA into a Physical Block Address (PBA) representing addresses of memory cells included in the memory device 100, in which data is to be stored. Also, the memory controller 200 may store, in a buffer memory therein, a logical-physical address mapping table that establishes a mapping relationship between the LBA and the PBA.

The memory controller 200 may control the memory device 100 to perform a program operation, a read operation, an erase operation, or the like in response to a request from the host 300. For example, when a program request is received from the host 300, the memory controller 200 may change the program request into a program command, and provide the memory device 100 with the program command, a PBA, and data. When a read request is received together with an LBA from the host 300, the memory controller 200 may change the read request into a read command, select a PBA corresponding to the LBA, and then provide the memory device 100 with the read command and the PBA. When an erase request is received together with an LBA from the host 300, the memory controller 200 may change the erase request into an erase command, select a PBA corresponding to the LBA, and then provide the memory device 100 with the erase command and the PBA.

In an embodiment, the memory controller 200 may autonomously generate a program command, an address, and data without any request from the host 300, and transmit the program command, the address, and the data to the memory device 100. For example, the memory controller 200 may provide the command, the address, and the data to the memory device 100 to perform a background operation such as a program operation for wear leveling and a program operation for garbage collection.

In an embodiment, the storage device 50 may further include a buffer memory (not shown). The memory controller 200 may control data exchange between the host 300 and the buffer memory. The memory controller 200 may temporarily store system data for controlling the memory device 100 in the buffer memory. For example, the memory controller 200 may temporarily store data input from the host 300 in the buffer memory, and then transmit the data temporarily stored in the buffer memory to the memory device 100.

In various embodiments, the buffer memory may be used as a working memory or cache memory of the memory controller 200. The buffer memory may store codes or commands executed by the memory controller 200. Alternatively, the buffer memory may store data processed by the memory controller 200.

In an embodiment, the buffer memory may be implemented with a Dynamic Random Access Memory (DRAM) such as a Double Data Rate Synchronous DRAM (DDR SDRAM), a DDR4 SDRAM, a Low Power Double Data Rate 4 (LPDDR4) SDRAM, a Graphics Double Data Rate (GDDR) SRAM, a Low Power DDR (LPDDR), or a Rambus Dynamic Random Access Memory (RDRAM), or a Static Random Access Memory (SRAM).

In various embodiments, the buffer memory may be outside of the storage device 50 and may be coupled to the storage device 50 via a wire or wirelessly. For example, one or more volatile memory (not shown) devices coupled to the storage device 50 at the outside of the storage device 50 may perform the functions of the buffer memory.

Memory device 100 may include one or more memory devices. For example, the memory controller 200 may control at least two memory devices 100. The memory controller 200 may control the at least two memory devices 100 according to an interleaving scheme so as to improve operational performance.

The host 300 may communicate with the storage device 50, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a Non-Volatile Memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

FIG. 2 is a diagram illustrating an example of a structure of the memory device shown in FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to a row decoder 121 through row lines RL. The plurality of memory blocks BLK1 to BLKz may be coupled to a page buffer group 123 through bit lines BL1 to BLn. Each of the plurality of memory blocks BLK1 to BLKz may include a plurality of memory cells. In an embodiment, the plurality of memory cells may be nonvolatile memory cells. Memory cells coupled to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as a Single Level Cell (SLC) storing one data bit, or a Multi-Level Cell (MLC) storing two or more data bits, such as a two-level cell storing two data bits, or a Triple Level Cell (TLC) storing three data bits, or a Quadruple Level Cell (QLC) storing four data bits.

The peripheral circuit 120 may perform a program operation, a read operation or an erase operation on a selected region of the memory cell array 110 under the control of the control logic 130. The peripheral circuit 120 may drive the memory cell array 110. For example, the peripheral circuit 120 may apply various operating voltages to the row lines RL and the bit lines BL1 to BLn or discharge the applied voltages under the control of the control logic 130.

The peripheral circuit 120 may include the row decoder 121, the voltage generator 122, the page buffer group 123, a column decoder 124, an input/output circuit 125, and a sensing circuit 126.

The row decoder 121 is coupled to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 may decode a row address RADD received from the control logic 130. The row decoder 121 may select at least one memory block among the memory blocks BLK1 to BLKz according to the decoded address. Also, the row decoder 121 may select at least one word line of the selected memory block to apply voltages generated by the voltage generator 122 to the at least one word line WL according the decoded address.

For example, in a program operation, the row decoder 121 may apply a program voltage to the selected word line, and apply a program pass voltage having a level lower than that of the program voltage to unselected word lines. In a program verify operation, the row decoder 121 may apply a verify voltage to the selected word line, and apply a verify pass voltage having a level higher than that of the verify voltage to the unselected word lines.

In a read operation, the row decoder 121 may apply a read voltage to the selected word line, and apply a read pass voltage having a level higher than that of the read voltage to the unselected word lines.

In an embodiment, an erase operation of the memory device 100 is performed in a memory block unit. In the erase operation, the row decoder 121 may select one memory block according to the decoded address. In the erase operation, the row decoder 121 may apply a ground voltage to word lines coupled to the selected memory blocks.

The voltage generator 122 may operate under the control of the control logic 130. The voltage generator 122 may generate a plurality of voltages by using an external power voltage supplied to the memory device 100. Specifically, the voltage generator may generate various operating voltages Vop used in program, read, and erase operations in response to an operation signal OPSIG. For example, the voltage generator 122 may generate a program voltage, a verify voltage, a pass voltage, a read voltage, an erased voltage, and the like under the control of the control logic 130.

In an embodiment, the voltage generator 122 may generate an internal power voltage by regulating the external power voltage. The internal power voltage generated by the voltage generator 122 may be used as an operation voltage of the memory device 100.

In an embodiment, the voltage generator 122 may generate a plurality of voltages by using the external power voltage or the internal power voltage.

For example, the voltage generator 122 may include a plurality of pumping capacitors for receiving the internal power voltage, and generate the plurality of voltages by selectively activating the plurality of pumping capacitors under the control of the control logic 130.

The plurality of generated voltages may be supplied to the memory cell array 110 by the row decoder 121.

The page buffer group 123 may include first to nth page buffers PB1 to PBn. The first to nth page buffers PB1 to PBn may be coupled to the memory cell array 110 respectively through first to nth bit lines BL1 to BLn. The first to nth bit lines BL1 to BLn may operate under the control of the control logic 130. Specifically, the first to nth bit lines BL1 to BLn may operate in response to page buffer control signals PBSIGNALS. For example, the first to nth page buffers PB1 to PBn may temporarily store data received through the first to nth bit lines BL1 to BLn, or sense voltages or current of the bit lines BL1 to BLn in a read or verify operation.

Specifically, in a program operation, the first to nth page buffers PB1 to PBn may transfer data DATA received through the input/output circuit 125 to selected memory cells through the first to nth bit lines BL1 to BLn, when a program voltage is applied to a selected word line. Memory cells of a selected page may be programmed according to the transferred data DATA. In a program verify operation, the first to nth page buffers PB1 to PBn may read page data by sensing voltages or currents received from the selected memory cells through the first to nth bit lines BL1 to BLn.

In a read operation, the first to nth page buffers PB1 to PBn may read data DATA from the memory cells of the selected page through the first to nth bit lines BL1 to BLn, and output the read data DATA to the input/output circuit 125 under the control of the column decoder 124.

In an erase operation, the first to nth page buffers PB1 to PBn may float the first to nth bit lines BL1 to BLn or apply an erase voltage.

The column decoder 124 may communicate data between the input/output circuit 125 and the page buffer group 123 in response to a column address CADD. For example, the column decoder 124 may communicate data with the first to nth page buffers PB1 to PBn through data lines EL, or communicate data with the input/output circuit 125 through column lines CL.

The input/output circuit 125 may transfer a command CMD and an address ADDR, which are received from the memory controller 200, to the control logic 130, or exchange data DATA with the column decoder 124.

In a read operation or verify operation, the sensing circuit 125 may generate a reference current in response to an allow bit VRYBIT signal, and output a pass or fail signal PASS/FAIL by comparing a sensing voltage VPB received from the page buffer group 123 and a reference voltage generated by the reference current.

The control logic 130 may control the peripheral circuit 120 by outputting the operation signal OPSIG, the row address RADD, the page buffer control signals PBSIGNALS, and the allow bit VRYBIT in response to the command CMD and the address ADDR. For example, the control logic 130 may control a read operation of a selected memory block in response to a sub-block read command and an address. Also, the control logic 130 may control an erase operation of a selected sub-block included in the selected memory block in response to a sub-block erase command and an address. Also, the control logic 130 may determine whether the verify operation has passed or failed in response to the pass or fail signal PASS or FAIL.

Each of the memory cells included in the memory cell array 110 may be programmed to any one program state among a plurality of program states according to data stored therein. A target program state of a memory cell may be determined as any one of the plurality of program states according to data stored in the memory cell.

FIG. 3 is a diagram illustrating a memory block.

Referring to FIGS. 2 and 3, FIG. 3 is a circuit diagram illustrating any one memory block BLKa among the plurality of memory blocks BLK1 to BLKz included in the memory cell array 110 shown in FIG. 2.

In the memory block BLKa, a first select line, word lines, and a second select line, which are arranged in parallel, may be coupled to each other. For example, the word lines may be arranged in parallel between the first and second select lines. The first select line may be a source select line SSL, and the second select line may be a drain select line DSL.

More specifically, the memory block BLKa may include a plurality of strings coupled between bit lines BL1 to BLn and a source line SL. The bit lines BL1 to BLn may be respectively coupled to the strings, and the source line SL may be commonly coupled to the strings. The strings may be configured identically to one another, and therefore, a string ST coupled to a first bit line BL1 will be described in detail as an example.

The string ST may include a source select transistor SST, a plurality of memory cells F1 to F16, and a drain select transistor DST, which may be coupled in series to each other between the source line SL and the first bit line BL1. At least one source select transistor SST and at least one drain select transistor DST may be included in one string ST, and memory cells of which number is greater than that of the memory cells F1 to F16 shown in the drawing may be included in the one string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings may be coupled to the source select line SSL, and gates of drain select transistors DST included in different strings may be coupled to the drain select line DSL. Gates of the memory cells F1 to F16 may be coupled to a plurality of word lines WL1 to WL16. A group of memory cells coupled to the same word line among memory cells included in different strings may be referred to as a physical page PPG. Therefore, physical pages corresponding to the number of the word lines WL1 to WL16 may be included in the memory block BLKa.

One memory cell may store data of one bit. The memory cell is generally referred to as a single level cell (SLC). One physical page PG may store one logical page (LPG) data. The one LPG data may include data bits of which number corresponds to that of cells included in one physical page PPG. Alternately, one memory cell MC may store data of two or more bits. The memory cell is generally referred to as a multi-level cell (MLC). One physical page PPG may store two or more LPG data.

Besides, memory cells for storing data of a plurality of bits have been developed, and this embodiment may be applied to memory systems including memory cells in which data of two or more bits are stored.

In another embodiment, each of the plurality of memory blocks may have a three-dimensional structure. Each memory block may include a plurality of memory cells stacked on a substrate. The plurality of memory cells may be arranged along+X, +Y, and +Z directions.

FIG. 4 is a diagram illustrating a process of outputting a soft read command.

Referring to FIG. 4, the memory controller 200 shown in FIG. 4 may include the error corrector 210, the command generator 220, and the read voltage controller 230.

In an embodiment, the command generator 220 may generate a read command READ_CMD, based on a read request READ_REQ received from the host 300, and output the generated read command READ_CMD to the memory device 100. The memory device 100 may receive the read command READ_CMD, to perform a read operation corresponding to the read command READ_CMD. The memory device 100 may output to the error corrector 210 read data READ_DATA that is data read by performing the read operation.

In an embodiment, the error corrector 210 may correct an error of the read data READ_DATA received from the memory device 100.

In an embodiment, an error may be included in the read data READ_DATA during a read process or due to degradation caused by retention. Therefore, in order to correct the error included in the read data READ_DATA, the error corrector 210 may perform an error correction operation by using a code such as Bose-Chaudhuri-Hocquenghem (BCH) code or a Low-Density Parity Check (LDPC) code.

However, when the error is not corrected by the error correction operation of the error corrector 210, the error corrector 210 may generate error information ERR_INF and output the generated error information ERR_INF to the command generator 220. The error information ERR_INF may represent that the error included in the read data READ_DATA has not been corrected. In an embodiment, an additional operation of the memory controller 200 may be performed to correct the error of the read data READ_DATA, based on the error information ERR_INF.

When the command generator 220 receives the error information ERR_INF from the error corrector 210, the command generator 220 may generate a cell distribution detection command CDS_CMD and output the generated cell distribution detection command CDS_CMD to the memory device 100. The cell distribution detection command CDS_CMD may instruct the memory device 100 to perform an operation for detecting a threshold voltage distribution of memory cells included in the memory device 100.

For example, after the memory device 100 performs a read operation, using predetermined read voltages, by receiving the cell distribution detection command CDS_CMD, the memory device 100 may output, to the read voltage controller 230, cell distribution detection data CDS_DATA including information on a number of memory cells turned on. The read voltage controller 230 may predict a threshold voltage distribution through the cell distribution detection data CDS_DATA received from the memory device 100.

Specifically, since the memory device 100 programs randomized data in a program operation, numbers of memory cells corresponding to respective program states may be substantially the same. For example, when the memory device 100 performs a program operation by using a Multi-Level Cell (MLC) scheme (e.g., a two-level cell scheme), randomized data may be programmed such that memory cells of an erase state, a first program state, a second program state, and a third program state can be equally distributed. This may be applied in the same manner even when the memory device 100 performs a program operation by using a Triple Level Cell (TLC) scheme or a Quadruple Level Cell (QLC) scheme.

Therefore, since randomized data is programmed, a number of memory cells turned on may be predicted in advance, when a read operation is performed using predetermined reference read voltages (e.g., the reference read voltages RS1 to RS3 illustrated in FIG. 5A).

However, although the read operation has been performed using the predetermined reference read voltages, the number of memory cells which are turned on may be different from the predicted number of memory cells. Therefore, based on such difference, it may be predicted that the threshold voltage distribution of memory cells has been changed.

In an embodiment of the present invention, in order to correct the error included in the read data READ_DATA, the read voltage controller 230 may calculate a Cell Difference Probability (CDP), based on the cell distribution detection data CDS_DATA received from the memory device 100, and determine slopes of adjacent threshold voltage distributions, based on a variation in the CDP. The read voltage controller 230 may output, to the command generator 220, read voltage information RV_INF for determining an interval between neighboring ones among the actual read voltages and a number of the actual read voltages, based on the slopes of the adjacent threshold voltage distributions.

Specifically, if the threshold voltage distribution is narrow, the slopes of the adjacent threshold voltage distributions may have a relatively large value. When the slopes of the adjacent threshold voltage distributions have a relatively large value, the read voltage controller 230 may set the interval between neighboring ones among the actual read voltages to be small. When the threshold voltage distribution is formed relatively narrow, the slope of the threshold voltage distribution may be steep. That is, when the slopes of the adjacent threshold voltage distributions are steep, it may be predicted that a number of memory cells are rapidly changed with reference to the threshold voltages of the memory cells, and hence it is necessary to set the interval between neighboring ones among the actual read voltages to be small. That is, it is necessary to more elaborately perform a read operation, i.e., to perform the read operation in more detail.

Therefore, when the slopes of the adjacent threshold voltage distributions are steep, the read voltage controller 230 may output, to the command generator 220, read voltage information RV_INF for allowing a read operation to be performed using read voltages having a small interval there between.

On the contrary, if the threshold voltage distribution is wide, the slopes of the adjacent threshold voltage distributions may have a relatively small value. When the slopes of the adjacent threshold voltage distributions have a relatively small value, the read voltage controller 230 may set the interval between neighboring ones among the actual read voltages to be great. When the threshold voltage distribution is formed relatively wide, the slope of the threshold voltage distribution may be moderate. That is, when the slopes of the adjacent threshold voltage distributions are moderate or small, it may be predicted that a change in the number of memory cells are small with reference to the threshold voltages of the memory cells, and hence the interval between neighboring ones among the actual read voltages may be set to be great.

Therefore, when the slopes of the adjacent threshold voltage distributions have a relatively small value, the read voltage controller 230 may output the read voltage information RV_INF to the command generator 220 such that a read operation is performed using read voltages having a large interval there between.

After the read voltage controller 230 determines read voltages with which a read operation is to be performed based on the cell distribution detection data CDS_DATA, the read voltage controller 230 may generate read voltage information RV_INF including information on the read voltages. Subsequently, the read voltage controller 230 may output the read voltage information RV_INF to the command generator 220.

The command generator 220 may output a soft read command SR_CMD to the memory device 100 such that a read operation is performed using read voltages generated according to the read voltage information RV_INF. The memory device 100 may perform a read operation by using read voltages determined corresponding to the soft read command SR_CMD.

FIG. 5A is a diagram illustrating an operation corresponding to a cell distribution detection command.

FIG. 5A, illustrates threshold voltage distributions of memory cells and a process of performing a read operation corresponding to a cell distribution detection command, and FIG. 5B illustrates a number of memory cells turned on according to the cell distribution detection command.

Referring to FIG. 5A, the horizontal axis of FIG. 5A represents the magnitude Vth of threshold voltage, and the vertical axis of FIG. 5A represents the number of memory cells. FIG. 5A illustrates threshold voltage distributions of memory cells when the memory device performs a program operation by using a Multi-Level Cell (MLC) (e.g., a two-level cell scheme) scheme. In another embodiment, the operation described in this drawing may be applied even when the memory device performs a program operation by using a Triple Level Cell (TLC) scheme or a Quadruple Level Cell (QLC) scheme.

Since the memory device 100 programs randomized data, the memory device may perform a program operation such that the numbers of the memory cells corresponding to an erase state E and the 1st to 3rd program states P1 to P3 are equally distributed as illustrated in FIG. 5A.

However, threshold voltage distributions may be changed during a read process or because of degradation caused by retention and the like. FIG. 5A illustrates threshold voltage distributions changed due to degradation caused by retention. That is, due to the degradation caused by the retention, a threshold voltage distribution of the first program state P1 may be changed to a threshold voltage distribution of a 1'st program state P1', a threshold voltage distribution of the 2nd program state P2 may be changed to a threshold voltage distribution of a 2'nd program state P2', and a threshold voltage distribution of the 3rd program state P3 may be changed to a threshold voltage distribution of a 3'rd program state P3'.

Due to such a change in threshold voltage distribution, an error may be included in read data read from the memory device 100, and the memory controller 200 may perform an error correction operation for correcting the error included in the read data. However, when the error is not corrected even though the memory controller 200 has performed the error correction operation, the memory controller 200 may output a cell distribution detection command for detecting a changed threshold voltage distribution to the memory device 100.

The memory device 100 may perform a read operation, using voltages RS1 to RS3, by receiving the cell distribution detection command. The voltages RS1 to RS3 may be read voltages for distinguishing the erase state E and the 1st program state P1 from each other, distinguishing the 1st program state P1 and the 2nd program state P2 from each other, and distinguishing the 2nd program state P2 and the 3rd program state P3 from each other when the memory cells included in the memory device 100 have ideal threshold voltage distributions. For example, RS1 may be a first read voltage, RS2 may be a second read voltage, and RS3 may be a third read voltage. Therefore, assuming that randomized data has been programmed, when the memory cells included in the memory device 100 have ideal threshold voltage distributions, a number of memory cells turned on when a read operation is performed using the voltages RS1 to RS3 may be predicted in advance.

Referring to FIG. 5A, when the number of memory cells corresponding to each of the erase E and the 1st to 3rd program states P1 to P3 is 1000, then the memory cells included in the memory device 100 may have ideal threshold voltage distributions. Thus, it may be predicted that an actual number ONES of the memory cells turned on when the memory device 100 performs a read operation by using the reference read voltage RS1 is 1000, an actual number ONES of the memory cells turned on when the memory device 100 performs a read operation by using the reference read voltage RS2 is 2000, and an actual number ONES of the memory cells turned on when the memory device 100 performs a read operation by using the reference read voltage RS3 is 3000.

However, when the threshold voltage distributions of the memory cells have changed, the actual numbers of memory cells which are turned on when a read operation is performed using the voltages RS1 to RS3 may differ from the predicted numbers.

FIG. 5B illustrates the number ONES of the memory cells turned on when a read operation is performed using the voltages RS1 to RS3 in a state in which the threshold voltage distributions of the memory cells have changed.

Specifically, when the threshold voltage distributions of the memory cells have ideal threshold voltage distributions, a number of memory cells turned on when the memory device 100 performs a read operation by using the reference read voltage RS1 is to be 1000, a number of memory cells turned on when the memory device 100 performs a read operation by using the reference read voltage RS2 is to be 2000, and a number of memory cells turned on when the memory device 100 performs a read operation by using the reference read voltage RS3 is to be 3000. However, the numbers of memory cells turned on may be changed as the threshold voltage distributions are changed.

For example, because the change in the threshold voltage distribution of each of the 1st and 2nd program states P1 and P2 is small, the numbers ONES of the memory cells which are turned on when a read operation is performed using the voltages RS1 and RS2 are equal to 1000 and 2000 of turned on memory cells, which are as predicted. However, since a change in the threshold voltage distribution corresponding to the 3rd program state P3 which is the highest program state is great, an actual number ONES of the memory cells turned on when a read operation is performed using the reference read voltage RS3 is 3100 which is different from the predicted number of 3000. In this case, an error correction operation may be performed based on the actual number of memory cells turned on.

In an embodiment, the memory controller 200 may receive cell distribution detection data corresponding to the cell distribution detection command. The cell distribution detection data may include information on a number of memory cells turned on when a read operation is performed using each read voltage. That is, the cell distribution detection data may include information representing that the number of memory cells turned on when a read operation is performed using the reference read voltage RS1 is 1000, the number of memory cells turned on when a read operation is performed using the reference read voltage RS2 is 2000, and the number of memory cells turned on when a read operation is performed using the reference read voltage RS3 is 3100.

The memory controller 200 may determine an optimum read voltage, based on the cell distribution detection data. For example, since the difference between the number of memory cells turned on when a read operation is performed using the voltages RS2 and RS3 is "1100," the memory controller 200 may determine, as the optimum read voltage, a read voltage for which the predicted difference between the number of memory cells turned on when a read operation is performed using the voltages RS2 and RS3 is "1000." Since the difference between numbers of memory cells turned on when a read operation is performed using the voltages RS1 and RS2 is "1000," the memory controller 200 may determine the voltages RS1 and RS2 as the optimum read voltage.

However, since the optimum read voltage determined based on the cell distribution detection data is determined according to a result obtained by performing a read operation, using predetermined read voltages, a read operation may fail even when the read operation is performed using the optimum read voltage and voltages adjacent to the optimum read voltage. Therefore, in order to determine more accurate read voltages, a Cell Difference Probability (CDP) is calculated as described in detail with reference to FIG. 7.

FIG. 6A is a diagram illustrating read voltages corresponding to a cell distribution detection command and cell distribution detection data.

FIG. 6A illustrates threshold voltage distributions changed due to degradation caused by retention and read voltages corresponding to a cell distribution detection command. FIG. 6B illustrates the number of memory cells turned on when a read operation is performed using the read voltages corresponding to the cell distribution detection command. In FIGS. 6A and 6B, a case is assumed for which the number of memory cells corresponding to each of the erase E and 1st to 3rd program states P1 to P3 is 1000.

FIG. 6A illustrates threshold voltage distributions of memory cells corresponding to the 2nd program state P2 and the 3rd program state P3 when the memory device 100 performs a program operation by using a Multi-Level Cell (MLC) scheme. The horizontal axis of FIG. 6A represents magnitude Vth of threshold voltage, and the vertical axis of FIG. 6A represents the number of memory cells. FIG. 6A illustrates threshold voltage distributions of memory cells corresponding to the 2nd program state P2 and the 3rd program state P3, which are changed due to degradation caused by retention.

FIG. 6A illustrates read voltages used in an operation corresponding to a cell distribution detection command after a read fail occurs since an error included in read data is not corrected when the memory device 100 performs a read operation corresponding to a read command received from the memory controller 200.

In an embodiment, the memory device 100 may perform a read operation, based on the cell distribution detection command received from the memory controller 200. For example, a read operation may be performed using read voltages for distinguishing the erase state and the program states in ideal threshold voltage distributions. In FIG. 6A, a reference read voltage RS33 may be a read voltage for distinguishing the 2nd and 3rd program states P2 and P3 from each other, when the memory cells have ideal threshold voltage distributions. Therefore, the memory device 100 may perform, corresponding to the cell distribution detection command, a read operation by using not only the reference read voltage RS33 but also reference read voltages RS31, RS32, RS34 and RS35 spaced by a substantially constant interval from the reference read voltage RS33.

For example, the memory device 100 may perform a read operation by using a reference read voltage RS31 lower by 2N than the reference read voltage RS33, a reference read voltage RS32 lower by N than the reference read voltage RS33, a reference read voltage RS34 higher by N than the reference read voltage RS33, and a reference read voltage RS35 higher by 2N than the reference read voltage RS33.

The memory device 100 may output to the memory controller cell distribution detection data including information on a number of memory cells turned on according to a read operation performed based on each voltage.

FIG. 6B illustrates the number ONES of the memory cells turned on, when a read operation is performed using the voltages RS31 to RS35. Since memory cells corresponding to the erase E and the 1st program state P1 are turned on when the read operation is performed using the RS31 to RS35, the number of memory cells turned on when the read operation is performed using the RS31 to RS35 may be greater than 2000.

Referring to FIG. 6B, an actual number ONES of the memory cells turned on when a read operation is performed using the reference read voltage RS31 may be 2600, an actual number ONES of the memory cells turned on when a read operation is performed using the reference read voltage RS32 may be 2800, an actual number ONES of the memory cells turned on when a read operation is performed using the reference read voltage RS33 may be 2900, an actual number ONES of the memory cells turned on when a read operation is performed using the reference read voltage RS34 may be 3100, and an actual number ONES of the memory cells turned on when a read operation is performed using the reference read voltage RS35 may be 3500.

Conventionally, an optimum read voltage was determined based on cell distribution detection data received through a cell distribution detection command.

However, since the optimum read voltage was determined without considering slopes of adjacent threshold voltage distributions, i.e., slopes of a portion at which a 2'nd program state P2' and a 3'rd program state P3' overlap with each other, a read operation failed even when the read operation was performed using the optimum read voltage.

Accordingly, in an embodiment of the present disclosure, there is proposed a method for calculating a Cell Difference Probability (CDP), based on cell distribution detection data, and determining a read voltage, based on the CDP.

FIG. 7A illustrates an equation for calculating a CDP, based on cell distribution detection data, and FIG. 7B illustrates CDPs calculated based on FIG. 6B. In FIG. 7, it is assumed that a number of memory cells included in each threshold voltage distribution is 1000 in ideal threshold voltage distributions.

In an embodiment, the read voltage controller 230 included in the memory controller 200 may calculate a CDP, based on cell distribution detection data received from the memory device 100. The CDP may represent a reliability of a result obtained by performing a read operation. For example, a small CDP may mean that the probability that an error will occur in read data is small, and a great CDP may mean that the probability that an error will occur in read data is great.

Referring to FIG. 7A, the CDP corresponding to a selected one among the reference read voltages (e.g., the reference read voltages RS31 to RS35) may be a value obtained by subtracting a value obtained by multiplying a reference number NOC of memory cells belonging to each of ideal threshold voltage distributions and a predicted number Pi of threshold voltage distributions, to which one or more memory cells belonging would be turned on due to the selected reference read voltage from an actual number ONES of the memory cells turned on due to the selected reference read voltage, and then dividing the value by the reference number NOC of memory cells belonging to each of ideal threshold voltage distributions.

For example, in FIG. 7B, since an actual number ONES of the memory cells turned on due to the reference voltage RS31 is 2600, the CDP corresponding to the reference voltage RS31 may be −0.4 that is obtained by subtracting a value (1000*3=3000) obtained by multiplying the reference number NOC of memory cells belonging to each of ideal threshold voltage distributions and the predicted number Pi of threshold voltage distributions, to which one or more memory cells would be turned on due to the reference voltage RS31 from the actual number ONES (2600) of memory cells turned on due to the selected reference read voltage (2600−3000=−400), and then dividing the value (−400) by the reference number NOC (1000) of memory cells belonging to each of ideal threshold voltage distributions.

Also, in FIG. 7B, since an actual number ONES of the memory cells turned on due to the reference voltage RS32 is 2800, the CDP corresponding to the reference voltage RS32 may be −0.2 that is obtained by subtracting a value (1000*3=3000) obtained by multiplying the reference number NOC of memory cells belonging to each of ideal threshold voltage distributions and the predicted number Pi of threshold voltage distributions, to which one or more memory cells belonging would be turned on due to the reference voltage RS32 from the actual number ONES (2800) of memory cells turned on due to the selected reference read voltage (2800−3000=−200), and then dividing the value (−200) by the reference number NOC (1000) of memory cells belonging to each of ideal threshold voltage distributions.

Also, in FIG. 7B, since an actual number ONES of the memory cells turned on due to the reference voltage RS33 is 2900, the CDP corresponding to the reference voltage RS33 may be −0.1 that is obtained by subtracting a value (1000*3=3000) obtained by multiplying the reference number NOC of memory cells belonging to each of ideal threshold voltage distributions and the predicted number Pi of threshold voltage distributions, to which one or more memory cells belonging would be turned on due to the reference voltage RS33 from the actual number ONES (2900) of memory cells turned on due to the selected reference read voltage (2900−3000=−100), and then dividing the value (−100) by the reference number NOC (1000) of memory cells belonging to each of ideal threshold voltage distributions.

Also, in FIG. 7B, since an actual number ONES of the memory cells turned on due to the reference voltage RS34 is 3100, the CDP corresponding to the reference voltage RS34 may be 0.1 that is obtained by subtracting a value (1000*3=3000) obtained by multiplying the reference number NOC of memory cells belonging to each of ideal threshold voltage distributions and the predicted number Pi of threshold voltage distributions, to which one or more memory cells belonging would be turned on due to the reference voltage RS34 from the actual number ONES (3100) of memory cells turned on due to the selected reference read voltage (3100−3000=100), and then dividing the value (100) by the reference number NOC (1000) of memory cells belonging to each of ideal threshold voltage distributions.

Also, in FIG. 7B, since an actual number ONES of the memory cells turned on due to the reference voltage RS35 is 3500, the CDP corresponding to the reference voltage RS35 may be 0.5 that is obtained by subtracting a value (1000*3=3000) obtained by multiplying the reference number NOC of memory cells belonging to each of ideal threshold voltage distributions and the predicted number Pi of threshold voltage distributions, to which one or more memory cells belonging would be turned on due to the reference voltage RS35 from the actual number ONES (3500) of memory cells turned on due to the selected reference read voltage (3500−3000=500), and then dividing the value (500) by the reference number NOC (1000) of memory cells belonging to each of ideal threshold voltage distributions.

As a result, it can be seen that data read when a read operation is performed using the reference read voltage RS33 or RS34 having the smallest CDP among the read voltages for distinguishing the 2nd and 3rd program states P2 and P3 has the smallest probability that an error will occur.

When the CDPs are calculated in this manner, the read voltage controller 230 may calculate variations in the CDP, based on the CDPs. For example, a variation in the CDP between the reference read voltages RS31 and RS32 may be calculated as 0.2, a variation in the CDP between the reference read voltages RS32 and RS33 may be calculated as 0.1, a variation in the CDP between the reference read voltages RS33 and RS34 may be calculated as 0.2, and a variation in the CDP between the reference read voltages RS34 and RS35 may be calculated as 0.4.

The read voltage controller 230 may determine slopes of adjacent threshold voltage distributions, based on the variation in the CDP. That is, it can be seen that a number of memory cells between the reference read voltages RS33 and RS34 having a great variation in the CDP is rapidly increased or decreased. Therefore, since it is necessary to more elaborately perform a read operation at a section at which the number of memory cells is rapidly increased or decreased, i.e., to perform the read operation in more detail. The read voltage controller 230 may set an interval between neighboring ones among the actual read voltages at which a read operation is to be performed between the reference read voltages RS33 and RS34 to be small.

On the contrary, when the variation in the CDP is small, the read voltage controller 230 may set an interval between neighboring ones among the actual read voltages at which a read operation is to be performed to be great.

An operation of the read voltage controller 230 will be described in more detail with reference to FIG. 8.

FIG. 8 is a diagram illustrating an operation of the read voltage controller that generates read voltage information, based on cell distribution data.

Referring to FIGS. 4 and 8, an operation of the read voltage controller (230 shown in FIG. 4) will be described in more detail. The read voltage controller 230 shown in FIG. 8 may include a Cell Difference Probability (CDP) calculator 231 and a read voltage determiner 233.

In an embodiment, the CDP calculator 231 may receive cell distribution detection data CDS_DATA from the memory device 100. The cell distribution detection data CDS_DATA may include information on a number of memory cells turned on after a read operation corresponding to a cell distribution detection command is performed.

The CDP calculator 231 may calculate a CDP, based on the received cell distribution detection data CDS_DATA. The CDP may represent a probability that an error will occur in read data. In an embodiment, the probability that the error will occur in the read data may become smaller as the CDP becomes smaller, and the probability that the error will occur in the read data may become greater as the CDP becomes greater.

The CDP calculator 231 may output, to the read voltage determiner 233, CDP information CDP_INF including information on the CDP.

The read voltage determiner 233 may calculate a variation in the CDP, based on the CDP information CDP_INF received from the CDP calculator 231.

In an embodiment, when the variation in the CDP is great, a number of memory cells may be rapidly decreased or increased between read voltages corresponding to the corresponding CDP. Therefore, the read voltage controller 230 may select read voltages by setting an interval between neighboring ones among the actual read voltages corresponding to the CDP to be small.

On the contrary, when the variation in the CDP is small, the number of memory cells may not be rapidly changed between the read voltages corresponding to the corresponding CDP. Therefore, the read voltage controller 230 may select read voltages by setting an interval between neighboring ones among the actual read voltages corresponding to the CDP to be great.

In an embodiment, when the variation in the CDP is great, the number of memory cells may be rapidly decreased or increased between the read voltages corresponding to the corresponding CDP, and hence it is necessary to perform a read operation by using a great number of actual read voltages. Therefore, when the variation in the CDP is great, the read voltage controller 230 may select read voltages of which number is relatively greater than that of read voltages when the variation in the CDP is small.

The read voltage determiner 233 may output, to the command generator 220, read voltage information RV_INF including information on the selected read voltages. The command generator 220 may output a soft read command to the memory device 100 such that a read operation is performed using the read voltages selected by the read voltage determiner 233.

FIG. 9 is a diagram illustrating an embodiment of read voltages determined when a variation in the CDP is substantially constant.

FIG. 9 illustrates threshold voltage distributions of memory cells corresponding to the 2nd and 3rd program states P2 and P3 changed due to degradation caused by retention and read voltages selected by the read voltage controller 230. The horizontal axis of FIG. 9 represents magnitude Vth of threshold voltage, and the vertical axis of FIG. 9 represents number of memory cells.

FIG. 9 illustrates read voltages determined after cell distribution detection data as a result obtained by performing an operation corresponding to a cell distribution detection command is received.

In an embodiment, a variation in the CDP may be substantially constant, as a result obtained when the read voltage controller 230 calculates a CDP, based on cell distribution detection data received from the memory device 100. Since the variation in the CDP is substantially constant, it may be determined that slopes at a section at which threshold voltage distributions of memory cells corresponding to the 2'nd and 3'rd program sates P2' and P3' overlap with each other are substantially the same. Therefore, the read voltage controller 230 may select actual read voltages having substantially the same interval between neighboring ones among the actual read voltages.

Specifically, in ideal threshold voltage distributions, an actual read voltage RP for distinguishing the second and third program states P2 and P3 from each other may be RP33. Therefore, the read voltage controller 230 may select an actual read voltage RP31 lower by 2Q than the actual read voltage RP33, an actual read voltage RP32 lower by Q than the actual read voltage RP33, an actual read voltage RP34 higher by Q than the actual read voltage RP33, and an actual read voltage RP35 higher by 2Q than the actual read voltage RP33. When the read voltage controller 230 selects read voltages, the memory device 100 may perform a read operation by using the selected read voltages.

Consequently, when the variation in the CDP is substantially constant, the actual read voltages having a substantially constant interval there between may be selected, and a read operation may be performed using the actual read voltages.

However, since it is necessary to adjust an interval between neighboring ones among the actual read voltages, based on a magnitude of CDP, read voltages may be selected according to the magnitude of CDP. An interval between read voltages determined based on a magnitude of CDP will be described in more detail with reference to FIG. 10.

FIG. 10 is a diagram illustrating another embodiment of the read voltages determined when the variation in the CDP is substantially constant.

Referring to FIG. 10, like FIG. 9, FIG. 10 illustrates threshold voltage distributions of memory cells corresponding to the 2nd and 3rd program states P2 and P3 changed due to degradation caused by retention and read voltages selected by the read voltage controller 230. The horizontal axis of FIG. 10 represents magnitude Vth of threshold voltage, and the vertical axis of FIG. 10 represents number of memory cells.

FIG. 10 illustrates read voltages determined after cell distribution detection data as a result obtained by performing an operation corresponding to a cell distribution detection command is received.

In an embodiment, a variation in the CDP may be substantially constant, as a result obtained when the read voltage controller 230 calculates a CDP, based on cell distribution detection data received from the memory device 100. Since the variation in the CDP is substantially constant, it may be determined that a section at which threshold voltage distributions of memory cells corresponding to the 2'nd and 3'rd program sates P2' and P3' overlap with each other has substantially the same slope. Therefore, the read voltage controller 230 may select actual read voltages having substantially the same interval between neighboring ones among the actual read voltages.

However, unlike the threshold voltage distributions of memory cells shown in FIG. 9, threshold voltage distributions of memory cells shown in FIG. 10 may have slopes rapidly changed at a section at which the 2'nd program state P2' and the 3'rd program state P3' overlap with each other. That is, although the variation in the CDP is substantially constant, a change in number of memory cells is great at the section at which the 2'nd program state P2' and the 3'rd program state P3' overlap with each other, and hence the magnitude of the CDP may be great. Therefore, the read voltage controller 230 may set an interval between neighboring ones among the actual read voltages to be smaller than that when the magnitude of the CDP is small.

Referring to FIG. 10, in ideal threshold voltage distributions, an actual read voltage for distinguishing the second and third program states P2 and P3 from each other may be RP33. The read voltage controller 230 may set, as an interval between neighboring ones among the actual read voltages, P that is a value smaller than Q as the interval between neighboring ones among the actual read voltages shown in FIG. 9.

Therefore, the read voltage controller 230 may select an actual read voltage RP31 lower by 2P than the actual read voltage RP33, an actual read voltage RP32 lower by P than the actual read voltage RP33, an actual read voltage RP34 higher by P than the actual read voltage RP33, and an actual read voltage RP35 higher by 2P than the actual read voltage RP33. When the read voltage controller 230 selects read voltages, the memory device 100 may perform a read operation by using the selected read voltages.

Consequently, when the magnitude of the CDP is great even though the variation in the CDP is substantially constant, read voltages having a small interval there between may be selected as compared with when the magnitude of the CDP is small, and a read operation may be performed using the selected read voltages.

In another embodiment, the slopes of threshold voltage distributions at the section at which the 2'nd program state P2' and the 3'rd program state P3' overlap with each other may be more gently changed. That is, although the variation in the CDP is substantially constant, a change in number of memory cells is small at the section at which the 2'nd program state P2' and the 3'rd program state P3' overlap with each other, and hence the magnitude of the CDP may be small. The read voltage controller 230 may set an interval between neighboring ones among the actual read voltages to be greater than that when the magnitude of the CDP is great.

FIG. 11 is a diagram illustrating an embodiment of read voltages determined when the variation in the CDP is not substantially constant.

Referring to FIGS. 9 to 11, like FIGS. 9 and 10, FIG. 11 illustrates threshold voltage distributions of memory cells corresponding to the 2nd and 3rd program states P2 and P3 changed due to degradation caused by retention and read voltages selected by the read voltage determiner. The horizontal axis shown in FIG. 11 represents magnitude Vth of threshold voltage, and the vertical axis shown in FIG. 11 represents number of memory cells. In FIG. 11, a case where an actual read voltage RP33 is a read voltage for distinguishing the second and third program states P2 and P3 from each other in ideal threshold voltage distributions to which the degradation caused by the retention is not reflected is assumed.

FIG. 11 illustrates read voltages determined after cell distribution detection data as a result obtained by performing an operation corresponding to a cell distribution detection command is received.

In an embodiment, a variation in the CDP may not be substantially constant, as a result obtained when the read voltage controller 230 calculates a CDP, based on cell distribution detection data received from the memory device 100. Since the variation in the CDP is not substantially constant, it may be determined that slopes at a section at which threshold voltage distributions of memory cells corresponding to the 2'nd and 3'rd program sates P2' and P3' overlap with each other are different from each other. Therefore, the read voltage controller 230 may determine an interval between neighboring ones among the actual read voltages and a number of the actual read voltages, based on the slopes at the section at which the threshold voltage distributions of memory cells corresponding to the 2'nd and 3'rd program sates P2' and P3' overlap with each other.

Referring to FIG. 11, based on the variation in the CDP, it may be determined that a slope at the left of the actual read voltage RP33 is moderate or small and a slope at the right of the actual read voltage RP33 is steep, at the section at which the threshold voltage distributions of memory cells corresponding to the 2'nd and 3'rd program sates P2' and P3' overlap with each other. That is, it may be determined that a slope at a section at which the variation in the CDP is small is moderate or small and a slope at a section at which the variation in the CDP is great is steep.

When the variation in the CDP is great, the read voltage controller 230 may set an interval between neighboring ones among the actual read voltages to be small, and select a greater number of the actual read voltages than that read voltages when the variation in the CDP is small. For example, the read voltage controller 230 may select an actual read voltage RP30 lower by 3P than the actual read voltage RP33, an actual read voltage RP31 lower by 2P than the actual read voltage RP33, and an actual read voltage RP32 lower by P than the actual read voltage RP33.

On the contrary, when the variation in the CDP is small, the read voltage controller 230 may set an interval between neighboring ones among the actual read voltages to be great, and select a smaller number of the actual read voltages than that read voltages when the variation in the CDP is great. For example, the read voltage controller 230 may set Q greater than P as an interval between neighboring ones among the actual read voltages, and select an actual read voltage RP34 greater by Q than the actual read voltage RP33 and an actual read voltage RP35 greater by 2Q than the actual read voltage RP33.

Consequently, when the variation in the CDP is not substantially constant, slopes at a section at which threshold voltage distributions overlap with each other may be predicted based on the variation in the CDP. In addition, when the predicted slopes are steep, the read voltage controller 230 may set an interval between neighboring ones among the actual read voltages to be small and set a number of actual read voltages to be great, based on the predicted slopes. When the predicted slopes are moderate or small, the read voltage controller 230 may set an interval between neighboring ones among the actual read voltages to be great and set a number of actual read voltages to be small, based on the predicted slopes.

FIG. 12 is a diagram illustrating an operation of the memory controller according to an embodiment of the present invention.

Referring to FIG. 12, in step S1201, the memory controller may output a cell distribution detection command to the memory device. The cell distribution detection command is a command output when an error of read data received from the memory device is not corrected, and may be a command for detecting threshold voltage distributions of memory cells included in the memory device.

In an embodiment, the memory device may perform an operation corresponding to the cell distribution detection command. That is, after the memory device performs a read operation by using read voltages for distinguishing an erase state and program states, based on the cell distribution detection command, the memory device may output cell distribution detection data including information on a number of memory cells turned on when a read operation is performed using each read voltage. The memory controller may receive cell distribution detection data from the memory device (S1203).

When the memory controller receives the cell distribution detection data from the memory device, the memory controller may calculate a Cell Difference Probability (CDP) (S1205). The CDP represents a reliability of a result obtained by performing a read operation, and may mean that the reliability of read data becomes greater as the CDP becomes smaller.

Subsequently, the memory controller may determine read voltages by calculating a variation in the CDP, based on the CDP (S1207). For example, when the variation in the CDP is substantially constant, the memory controller may determine an interval between neighboring ones among the actual read voltages and a number of the actual read voltages, based on the magnitude of the CDP. When the variation in the CDP is not substantially constant, the memory controller may predict slopes at a section at which threshold voltage distributions overlap with each other, based on the variation in the CDP, and determine an interval between neighboring ones among the actual read voltages and a number of the actual read voltages, based on the predicted slopes.

FIG. 13 is a diagram illustrating an operation of the memory controller according to an embodiment of the present invention.

Referring to FIGS. 12 and 13, FIG. 13 is a flowchart illustrating in detail the step S1207.

In step S1301, the memory controller may calculate a variation in Cell Difference Probability (CDP), based on the CDP. The variation in the CDP may be substantially constant or may not be substantially constant.

In an embodiment, when the variation in the CDP is substantially constant, the memory controller may determine read voltages, based on the magnitude of the CDP (S1305).

Specifically, when the variation in the CDP is substantially constant, the memory controller may predict that slopes at a section at which threshold voltage distributions overlap with each other are substantially the same. Therefore, the memory controller may select actual read voltages having a substantially constant interval there between. When the CDP is greater than a reference value, the memory controller may select read voltages having a small interval there between. On the contrary, when the CDP is smaller than the reference value, the memory controller may select read voltages having a large interval there between.

In an embodiment, when the variation in the CDP is not substantially constant, the memory controller may predict a slope of adjacent threshold voltage distributions, based on the variation in the CDP (S1307). That is, the memory controller may predict slopes at a section at which threshold voltage distributions overlap with each other.

Specifically, when the variation in the CDP is great, it may be predicted that the slopes at the section at which the threshold voltage distributions overlap with each other are steep. Therefore, the memory controller may select read voltages having a small interval there between. When the variation in the CDP is great, the memory controller may select greater number of the actual read voltages than that of read voltages when the variation in the CDP is small (S1309).

On the contrary, when the variation in the CDP is small, it may be predicted that the slopes at the section at which the threshold voltage distributions overlap with each other are moderate or small. Therefore, the memory controller may select read voltages having a large interval there between. When the variation in the CDP is small, the memory controller may select smaller number of the actual read voltages than that of read voltages when the variation in the CDP is great (S1309).

In an embodiment, the interval between neighboring ones among the actual read voltages may be determined to be smaller than a reference value, when it is predicted that the slopes at the section at which the threshold voltage distributions overlap with each other are steeper than a reference slope, and the interval between neighboring ones among the actual read voltages may be determined to be greater than the reference value, when it is predicted that the slopes at the section at which the threshold voltage distributions overlap with each other are smaller than the reference slope.

FIG. 14 is a diagram illustrating an operation of the memory controller according to an embodiment of the present invention.

Referring to FIGS. 13 and 14, FIG. 14 is a flowchart illustrating in detail the step S1309.

In step S1401, the memory controller may determine whether the slopes are steep within the overlapping section between the threshold voltage distributions, based on the predicted slopes of the threshold voltage distributions.

When the slopes are steep within the overlapping section between the threshold voltage distributions, the memory controller may select read voltages having a small interval there between (S1403). A number of the selected read voltages may be greater than that of read voltages when the slopes at the section at which the threshold voltage distributions overlap with each other are moderate or small.

When the slopes at the section at which the threshold voltage distributions overlap with each other are not steep but moderate or small, the memory controller may select read voltages having a large interval there between (S1405). A number of the selected read voltages may be smaller than that of read voltages when the slopes are steep within the overlapping section between the threshold voltage distributions.

FIG. 15 is a diagram illustrating another embodiment of the memory controller shown in FIG. 1.

Referring to FIG. 15, a memory controller 1000 is connected to a host and a memory device. The memory controller 1000 is configured to access the memory device in response to a request received from the host. For example, the memory controller 1000 is configured to control read, program, erase, and background operations of the memory device. The memory controller 1000 is configured to provide an interface between the memory device and the host. The memory controller 1000 is configured to drive firmware for controlling the memory device.

The memory controller 1000 may include a processor 1010, a memory buffer 1020, an error correction code (ECC) circuit 210, a host interface 1040, a buffer control circuit 1050, a memory interface 1060, and a bus 1070. In an embodiment, the ECC circuit 210 may perform the same operation as the error corrector shown in FIGS. 1 and 4.

The bus 1070 may be configured to provide channels between components of the memory controller 1000.

The processor 1010 may control overall operations of the memory controller 1000, and perform a logical operation. The processor 1010 may communicate with the external host through the host interface 1040, and communicate with the memory device through the memory interface 1060. Also, the processor 1010 may communicate with the memory buffer 1020 through the buffer control circuit 1050. The processor 1010 may control an operation of the storage device, using the memory buffer 1020 as a working memory, a cache memory or a buffer memory.

The processor 1010 may perform a function of a flash translation layer (FTL). The processor 1010 may translate a logical block address (LBA) provided by the host through the FTL into a physical block address (PBA). The FTL may receive an LBA, using a mapping table, to be translated into a PBA. Several address mapping methods of the FTL exist according to mapping units. A representative address mapping method may include a page mapping method, a block mapping method, and a hybrid mapping method.

The processor 1010 is configured to randomize data received from the host. For example, the processor 1010 may randomize data received from the host, using a randomizing seed. The randomized data is provided as data to be stored to the memory device to be programmed in the memory cell array.

The processor 1010 may perform randomizing and derandomizing by driving software or firmware.

The memory buffer 1020 may be used as the working memory, the cache memory, or the buffer memory of the processor 1010. The memory buffer 1020 may store codes and commands, which are executed by the processor 1010. The memory buffer 1020 may include a Static RAM (SRAM) or a Dynamic RAM (DRAM).

The ECC circuit 210 may perform an ECC operation. The ECC circuit 210 may perform ECC encoding on data to be written in the memory device through the memory interface 1060. The ECC encoded data may be transferred to the memory device through the memory interface 1060. The ECC circuit 210 may perform ECC decoding on data received from the memory device through the memory interface 1060. In an example, the ECC circuit 210 may be included as a component of the memory interface 1060 in the memory interface 1060.

In the present disclosure, when error correction of the ECC circuit 210 fails, the ECC circuit 210 may receive data for predicting threshold voltage distributions of memory cells from the memory device 100, and select read voltages by predicting the threshold voltage distributions.

Specifically, the ECC circuit 210 may receive information on a number of memory cells turned on by performing a read operation, using read voltages for distinguishing program states in ideal threshold voltage distributions of memory cells. The ECC circuit 210 may predict threshold voltage distributions of memory cells, based on the number of memory cells turned on, and predict a Cell Difference Probability (CDP) according to the predicted threshold voltage distributions and slopes at a section at which threshold voltage distributions overlap with each other according to a variation in the CDP. The ECC circuit 210 may select read voltages, based on the predicted slopes.

The host interface 1040 may communicate with the external host under the control of the processor 1010. The host interface 1040 may communicate with the host, using at least one of various communication manners, such as a Universal Serial bus (USB), a Serial AT Attachment (SATA), a High Speed InterChip (HSIC), a Small Computer System Interface (SCSI), Firewire, a Peripheral Component Interconnection (PCI), a PCI express (PCIe), a nonvolatile memory express (NVMe), a Universal Flash Storage (UFS), a Secure Digital (SD), a Multi-Media Card (MMC), an embedded MMC (eMMC), a Dual In-line Memory Module (DIMM), a Registered DIMM (RDIMM), and a Load Reduced DIMM (LRDIMM).

The buffer control circuit 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

In an example, the memory controller 1000 may not include the memory buffer 1020 and the buffer control circuit 1050.

In an example, the processor 1010 may control an operation of the memory controller 1000 by using codes. The processor 1010 may load codes from a nonvolatile memory device (e.g., a read only memory (ROM)) provided in the memory controller 1000. In another example, the processor 1010 may load codes from the memory device through the memory interface 1060.

In an example, the bus 1070 of the memory controller 1000 may be divided into a control bus and a data bus. The data bus may be configured to transmit data in the memory controller 1000, and the control bus may be configured to transmit control information such as a command and an address in the memory controller 1000. The data bus and the control bus are separated from each other, and may not interfere or influence with each other. The data bus may be connected to the host interface 1040, the buffer control circuit 1050, the ECC circuit 210, and the memory interface 1060. The control bus may be connected to the host interface 1040, the processor 1010, the buffer control circuit 1050, the memory buffer 1020, and the memory interface 1060.

FIG. 16 is a block diagram exemplarily illustrating a memory card system to which the storage device is applied according to an embodiment of the present invention.

Referring to FIG. 16, the memory card system 2000 may include a memory controller 2100, a memory device, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and a host. The memory controller 2100 is configured to driver firmware for controlling the memory device 2200. The memory device 2200 may be implemented identically to the memory device 100 described with reference to FIG. 2.

In the present disclosure, when error correction of on read data received from the memory device 2200 fails, the memory controller 2100 may receive data for predicting threshold voltage distributions of memory cells from the memory device 2200, and select read voltages by predicting the threshold voltage distributions.

Specifically, the memory controller 2100 may receive, from the memory device 2200, information on a number of memory cells turned on by performing a read operation, using read voltages for distinguishing program states in ideal threshold voltage distributions of memory cells. The memory controller 2100 may predict threshold voltage distributions of memory cells, based on the number of memory cells turned on, and predict a Cell Difference Probability (CDP) according to the predicted threshold voltage distributions and slopes at a section at which threshold voltage distributions overlap with each other according to a variation in the CDP. The memory controller 2100 may select read voltages, based on the predicted slopes.

In an example, the memory controller 2100 may include components such as a Random Access Memory (RAM), a processing unit, a host interface, a memory interface, and the error corrector 233.

The memory controller 2100 may communicate with an external device through the connector 2300. The memory controller 2100 may communicate with the external device (e.g., the host) according to a specific communication protocol. In an example, the memory controller 2100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe.

In an example, the memory device 2200 may be implemented with various nonvolatile memory devices such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Torque Transfer magnetic RAM (STT-MRAM).

The memory controller 2100 and the memory device 2200 may be integrated into a single semiconductor device, to constitute a memory card. For example, the memory controller 2100 and the memory device 2200 may constitute a memory card such as a PC card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

FIG. 17 is a block diagram exemplarily illustrating a Solid State Drive (SSD) system to which the storage device is applied according to an embodiment of the present invention.

Referring to FIG. 17, the SSD system 3000 may include a host 3100 and an SSD 3200. The SSD 3200 exchanges a signal SIG with the host 3100 through a signal connector 3001, and receives power PWR through a power connector 3002. The SSD 3200 may include an SSD controller 3210, a plurality of flash memories 3221 to 322n, an auxiliary power supply 3230, and a buffer memory 3240.

In an embodiment, the SSD controller 3210 may serve as the memory controller 200 described with reference to FIG. 1.

The SSD controller 3210 may control the plurality of flash memories 3221 to 322n in response to a signal SIG received from the host 3100. In an example, the signal SIG may be a signal based on an interface between the host 3100 and the SSD 3200. For example, the signal SIG may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

In the present disclosure, when error correction of on read data received from the flash memories 3221 to 322n fails, the SSD controller 3210 may receive data for predicting threshold voltage distributions of memory cells from the flash memories 3221 to 322n, and select read voltages by predicting the threshold voltage distributions.

Specifically, the SSD controller 3210 may receive, from the flash memories 3221 to 322n, information on a number of memory cells turned on by performing a read operation, using read voltages for distinguishing program states in ideal threshold voltage distributions of memory cells. The SSD controller 3210 may predict threshold voltage distributions of memory cells, based on the number of memory cells turned on, and predict a Cell Difference Probability (CDP) according to the predicted threshold voltage distributions and slopes at a section at which threshold voltage distributions overlap with each other according to a variation in the CDP. The SSD controller 3210 may select read voltages, based on the predicted slopes.

The auxiliary power supply 3230 is connected to the host 3100 through the power connector 3002. When the supply of power from the host 3100 is not smooth, the auxiliary power supply 3230 may provide power of the SSD 3200. In an example, the auxiliary power supply 3230 may be located in the SSD 3200, or be located at the outside of the SSD 3200. For example, the auxiliary power supply 3230 may be located on a main board, and provide auxiliary power to the SSD 3200.

The buffer memory 3240 may operate as a buffer memory of the SSD 3200. For example, the buffer memory 3240 may temporarily store data received from the host 3100 or data received from the plurality of flash memories 3221 to 322n, or temporarily store meta data (e.g., a mapping table) of the flash memories 3221 to 322n. The buffer memory 3240 may include volatile memories such as a DRAM, an SDRAM, a DDR SDRAM, an LPDDR SDRAM, and a GRAM or nonvolatile memories such as a FRAM, a ReRAM, an STT-MRAM, and a PRAM.

FIG. 18 is a block diagram exemplarily illustrating a user system to which the storage device is applied according to an embodiment of the present invention.

Referring to FIG. 18, the user system 4000 may include an application processor 4100, a memory module 4200, a network module 4300, a storage module 4400, and a user interface 4500.

The application processor 4100 may drive components included in the user system 4000, an operating system (OS), a user program, or the like. In an example, the application processor 4100 may include controllers for controlling components included in the user system 4000, interfaces, a graphic engine, and the like. The application processor 4100 may be provided as a System-on-Chip (SoC).

In the present disclosure, when error correction of on read data received from the storage module 4400 fails, the application processor 4100 may receive data for predicting threshold voltage distributions of memory cells from the storage module 4400, and select read voltages by predicting the threshold voltage distributions.

Specifically, the application processor 4100 may receive, from the storage module 4400, information on a number of memory cells turned on by performing a read operation, using read voltages for distinguishing program states in ideal threshold voltage distributions of memory cells. The application processor 4100 may predict threshold voltage distributions of memory cells, based on the number of memory cells turned on, and predict a Cell Difference Probability (CDP) according to the predicted threshold voltage distributions and slopes at a section at which threshold voltage distributions overlap with each other according to a variation in the CDP. The application processor 4100 may select read voltages, based on the predicted slopes.

The memory module 4200 may operate as a main memory, working memory, buffer memory or cache memory of the user system 4000. The memory module 4200 may include volatile random access memories such as a DRAM, an SDRAM, a DDR SDRAM, a DDR2 SDRM, a DDR3 SDRAM, an LPDDR SDRAM, an LPDDR2 SDRAM, and an LPDDR3 SDRAM or nonvolatile random access memories such as a PRAM, a ReRAM, an MRAM, and a FRAM. In an example, the application processor 4100 and the memory module 4200 may be provided as one semiconductor package by being packaged based on a Package on Package (PoP).

The network module 4300 may communicate with external devices. In an example, the network module 4300 may support wireless communications such as Code Division Multiple Access (CDMA), Global System for Mobile communication (GSM), Wideband CDMA (WCDMA), CDMA-2000, Time Division Multiple Access (TDMA), Long Term Evolution (LTE), Wimax, WLAN, UWB, Bluetooth, and Wi-Fi. In an example, the network module 4300 may be included in the application processor 4100.

The storage module 4400 may store data. For example, the storage module 4400 may store data received from the application processor 4100. Alternatively, the storage module 4400 may transmit data stored therein to the application processor 4100. In an example, the storage module 4400 may be implemented with a nonvolatile semiconductor memory device such as a Phase-change RAM (PRAM), a Magnetic RAM (MRAM), a Resistive RAM (RRAM), a NAND flash, a NOR flash, or a NAND flash having a three-dimensional structure. In an example, the storage module 4400 may be provided as a removable drive such as a memory card of the user system 4000 or an external drive.

In an example, the storage module 4400 may include a plurality of nonvolatile memory devices, and the plurality of nonvolatile memory devices may operate identically to the memory device described with reference to FIGS. 2 and 3. The storage module 4400 may operate identically to the storage device 50 described with reference to FIG. 1.

The user interface 4500 may include interfaces for inputting data or commands to the application processor 4100 or outputting data to an external device. In an example, the user interface 4500 may include user input interfaces such as a keyboard, a keypad, a button, a touch panel, a touch screen, a touch pad, a touch ball, a camera, a microphone, a gyroscope sensor, a vibration sensor and a piezoelectric element. The user interface 4500 may include user output interfaces such as a Liquid Crystal Display (LCD), an Organic Light Emitting Diode (OLED) display device, an Active Matrix OLED (AMOLED) display device, an LED, a speaker, and a monitor.

In accordance with the present disclosure, when a read operation fails, the memory controller receives information on a number of memory cells turned on from the memory device, predicts slopes of adjacent threshold voltage distributions, based on the number of memory cells turned on, and then perform a soft decoding operation by determining a number of actual read voltages and an interval between neighboring ones among the actual read voltages, based on the predicted slopes.

While the present disclosure has been shown and described with reference to certain exemplary embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described exemplary embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the exemplary embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory controller for controlling a memory device, the memory controller comprising:
    an error corrector configured to correct an error in read data read with a reference voltage and received from the memory device;

a command generator configured to output, in response to failing an error correction operation of the error corrector, a cell distribution detection command for detecting threshold voltage distributions of memory cells included in the memory device; and a read voltage controller configured to determine, based on cell distribution detection data that the memory device provides in response to the cell distribution detection command, a number of read voltages and an interval of the read voltages for distinguishing neighboring two threshold voltage distributions among the threshold voltage distributions, wherein the read voltages include first read voltages greater than the reference voltage, and second read voltages less than the reference voltage, and wherein the read voltage controller determines a number of the first read voltages and an interval of the first read voltages, and a number of the second read voltages and an interval of the second read voltages.

2. The memory controller of claim 1, wherein the cell distribution detection data includes information on a number of memory cells turned on in a read operation performed in response to the cell distribution detection command.

3. The memory controller of claim 1, wherein the read voltage controller includes:

a Cell Difference Probability (CDP) calculator configured to calculate a CDP representing a reliability of the read data, based on the cell distribution detection data; and a read voltage determiner configured to generate read voltage information on the number of read voltages and the interval of the read voltages, based on the CDP.

4. The memory controller of claim 3, wherein the read voltage determiner calculates a variation in the CDP, based on the CDP, and predicts slopes of threshold voltage distributions overlapping with each other among the threshold voltage distributions of the memory cells included in the memory device, based on the variation in the CDP.

5. The memory controller of claim 4, wherein, when the variation in the CDP is constant, the read voltage determiner predicts that the slopes of the threshold voltage distributions overlapping with each other are the same.

6. The memory controller of claim 5, wherein the read voltage determiner determines the interval of the read voltages, based on a magnitude of the CDP.

7. The memory controller of claim 6, wherein the read voltage determiner:

determines the interval of the read voltages as a first voltage, when the magnitude of the CDP is greater than a reference value; and determines the interval of the read voltages as a second voltage greater than the first voltage, when the magnitude of the CDP is smaller than the reference value.

8. The memory controller of claim 4, wherein, when the variation in the CDP is not constant, the read voltage determiner predicts that the slopes of the threshold voltage distributions overlapping with each other are different from each other.

9. The memory controller of claim 8, wherein the read voltage determiner:

determines the interval of the read voltages to be smaller than a reference value, when it is predicted that the slopes of the threshold voltage distributions overlapping with each other are steeper than a reference slope; and determines the interval of the read voltages to be greater than the reference value, when it is predicted that the slopes of the threshold voltage distributions overlapping with each other are smaller than the reference slope.

10. The memory controller of claim 9, wherein the read voltage determiner determines, when it is predicted that the slopes of the threshold voltage distributions overlapping with each other are steeper than the reference slope, the number of read voltages to be relatively greater than that of read voltages when it is predicted that the slopes of the threshold voltage distributions overlapping with each other are smaller than the reference slope.

11. A method for operating a memory controller for controlling a memory device, the method comprising:

correcting an error of read data read with a reference voltage and received from the memory device;

outputting, in response to failing an error correction operation of the error corrector, a cell distribution detection command for detecting threshold voltage distributions of memory cells included in the memory device; and determining, based on cell distribution detection data that the memory device provides in response to the cell distribution detection command, a number of read voltages and an interval of the read voltages for distinguishing neighboring two threshold voltage distributions among the threshold voltage distributions, wherein the read voltages include first read voltages greater than the reference voltage, and second read voltages less than the reference voltage, and wherein a number of the first read voltages and an interval of the first read voltages, and a number of the second read voltages and an interval of the second read voltages are determined.

12. The method of claim 11, wherein the determining of the number of read voltages and the interval of the read voltages includes:

calculating a Cell Difference Probability (CDP) representing a reliability of the read data, based on the cell distribution detection data;

calculating a variation in the CDP, based on the CDP; and predicting slopes of threshold voltage distributions overlapping with each other among the threshold voltage distributions of the memory cells included in the memory device, based on the variation in the CDP.

13. The method of claim 12, wherein the slopes of the threshold voltage distributions overlapping with each other are predicted to be the same when the variation in the CDP is constant.

14. The method of claim 13, wherein the interval of the read voltages is determined based on a magnitude of the CDP.

15. The method of claim 14, wherein the interval of the read voltages is determined as a first voltage, when the magnitude of the CDP is greater than a reference value, and wherein the interval of the read voltages is determined as a second voltage greater than the first voltage, when the magnitude of the CDP is smaller than the reference value.

16. The method of claim 12, wherein the slopes of the threshold voltage distributions overlapping with each other are predicted to be different from each other, when the variation in the CDP is not constant.

17. The method of claim 16, wherein the interval of the read voltages is determined to be smaller than a reference value, when it is predicted that the slopes of the threshold voltage distributions overlapping with each other are steeper than a reference slope.

18. The method of claim 16, wherein the interval of the read voltages is determined to be greater than the reference value, when it is predicted that the slopes of the threshold voltage distributions overlapping with each other are smaller than a reference slope.

19. The method of claim 17, wherein the number of read voltages is determined, when it is predicted that the slopes of the threshold voltage distributions overlapping with each other are steeper than the reference slope, to be relatively greater than that of read voltages when it is predicted that the slopes of the threshold voltage distributions overlapping with each other are smaller than the reference slope.

20. The method of claim 19, further comprising outputting, to the memory device, a soft read command for performing a read operation by using the determined read voltages.

\* \* \* \* \*